United States Patent [19]

Miura

[11] Patent Number: 5,053,993

[45] Date of Patent: Oct. 1, 1991

[54] MASTER SLICE TYPE SEMICONDUCTOR INTEGRATED CIRCUIT HAVING SEA OF GATES

[75] Inventor: Daisuke Miura, Yokohama, Japan

[73] Assignee: Fujitsu Limited, Kawasaki, Japan

[21] Appl. No.: 490,397

[22] Filed: Mar. 8, 1990

[30] Foreign Application Priority Data

Jun. 8, 1987 [JP] Japan .................. 62-142493
Jun. 8, 1987 [JP] Japan .................. 62-142499

[51] Int. Cl.$^5$ .................. H01L 27/105; H01L 27/118
[52] U.S. Cl. .................. 365/104; 365/156; 307/465.1; 307/469
[58] Field of Search .................. 357/42, 45; 365/104, 365/156; 307/465.1, 469

[56] References Cited

U.S. PATENT DOCUMENTS

| 4,611,236 | 9/1986 | Sato .................. | 357/4 J |
| 4,668,972 | 5/1987 | Sato et al. .................. | 357/4 J |
| 4,745,307 | 5/1988 | Kitamura et al. .................. | 357/4 J |
| 4,750,027 | 6/1988 | Asami .................. | 357/4 J |

FOREIGN PATENT DOCUMENTS 58-139446 8/1983 Japan .................. 357/45 M

Primary Examiner—William D. Larkins
Attorney, Agent, or Firm—Staas & Halsey

[57] ABSTRACT

A master slice type semiconductor integrated circuit which includes a semiconductor chip, input/output cells arranged in a peripheral portion of the semiconductor chip, and basic cells arranged in an entire central portion of the semiconductor chip excluding the peripheral portion of the semiconductor chip. Each of the basic cells are formed by a complementary metal oxide semiconductor (MOS) forming part and an N-channel metal oxide semiconductor (NMOS) forming part. The CMOS forming part forms a CMOS by employing same number of P-channel metal oxide semiconductor (PMOS) transistors and NMOS transistors, while the NMOS forming part forms a plurality of NMOS transistors on at least one end of the CMOS forming part in a direction parallel to the CMOS forming part.

18 Claims, 23 Drawing Sheets

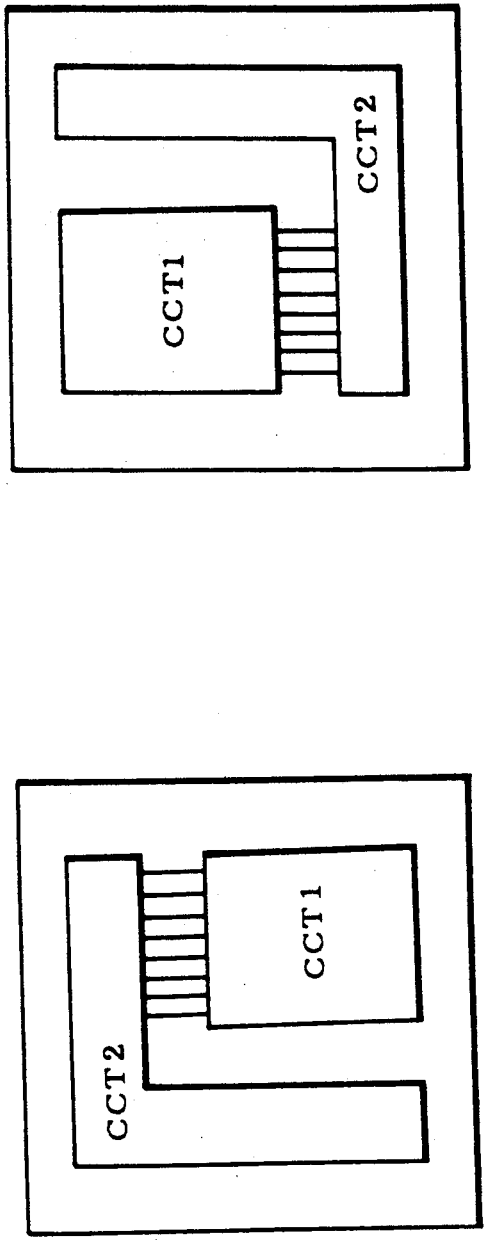

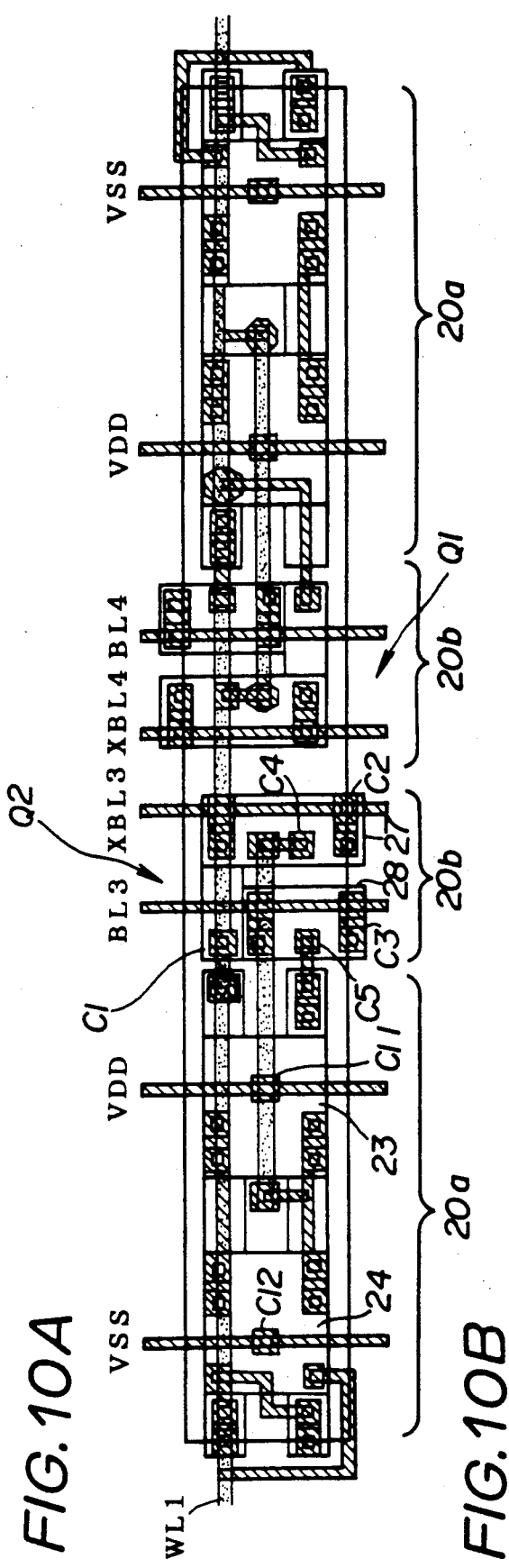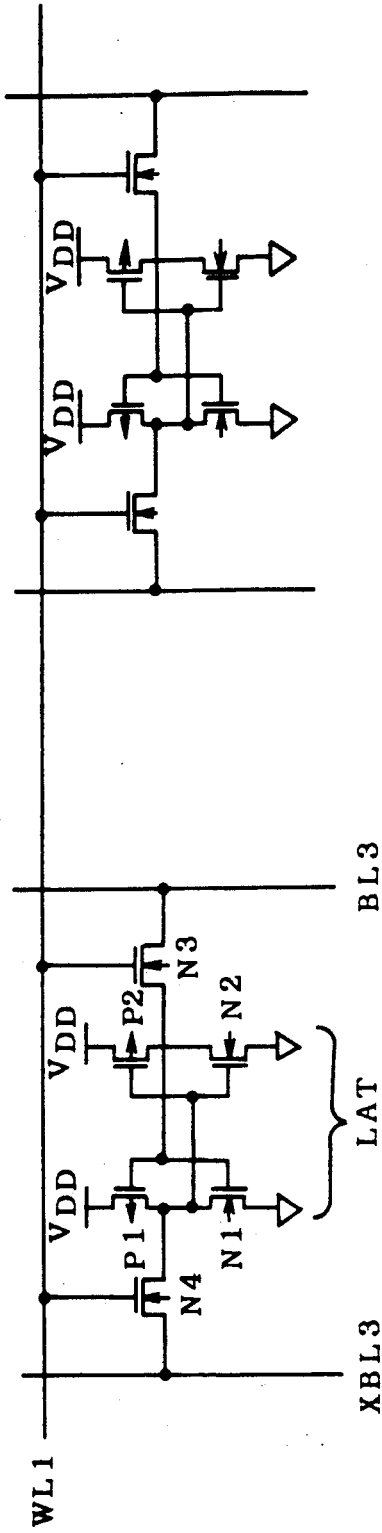
FIG. 10A
FIG. 10B

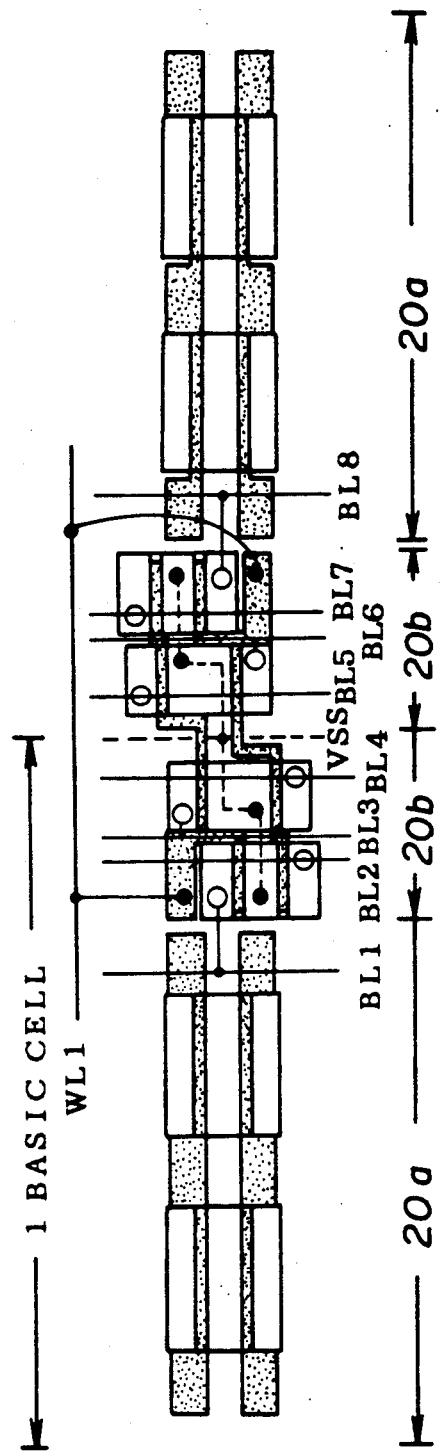

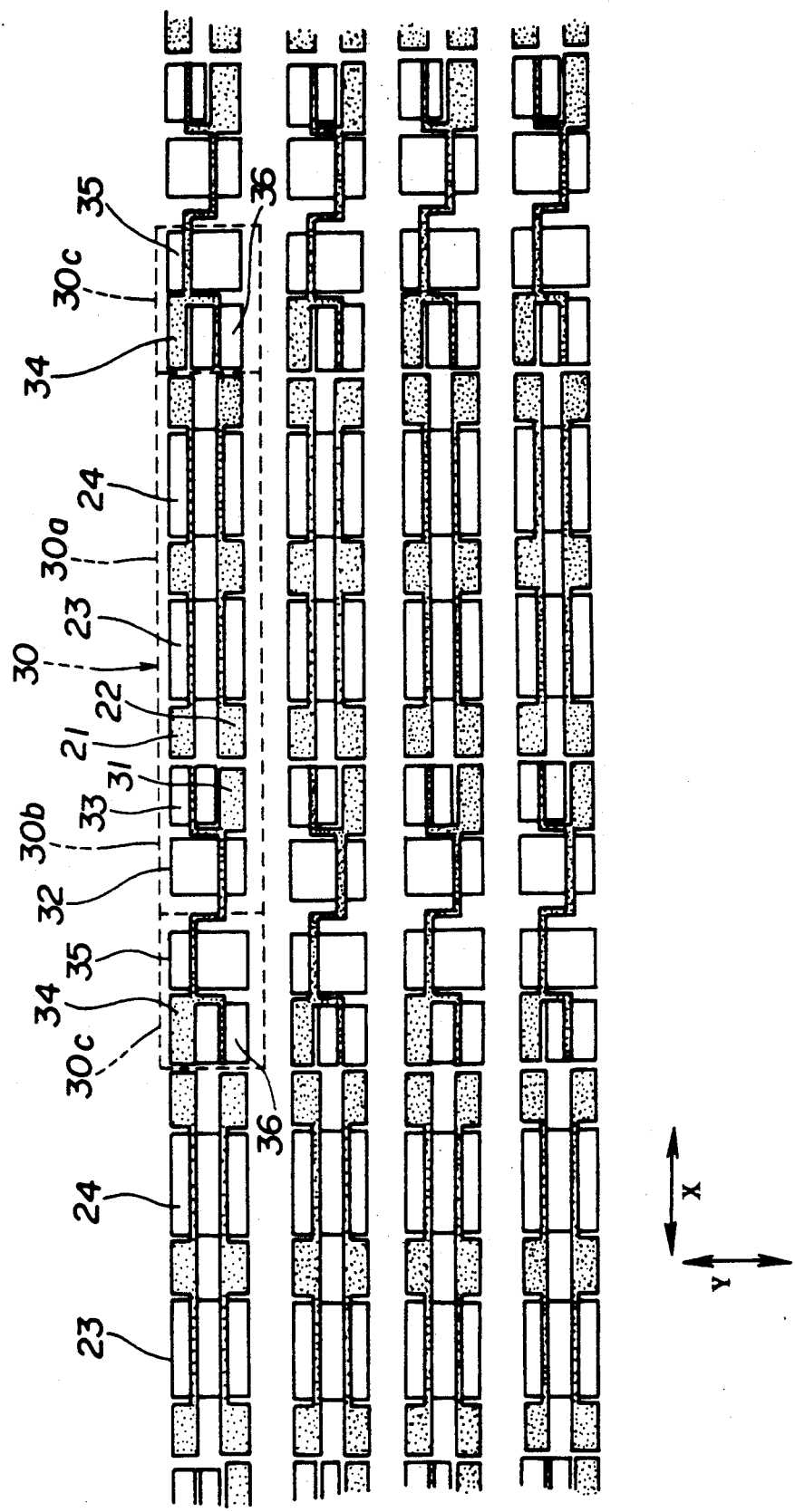

MASTER SLICE TYPE SEMICONDUCTOR INTEGRATED CIRCUIT HAVING SEA OF GATES

This is a continuation of copending application Ser. No. 07/203,922 filed on June 8, 1988, now abandoned.

BACKGROUND OF THE INVENTION

The present invention generally relates to master slice type semiconductor integrated circuits, and more particularly to a master slice type semiconductor integrated circuit having a sea of gates.

Generally, in a master slice type semiconductor integrated circuit, a plurality of columns of basic cells are arranged with interconnection (wiring) channels sandwiched therebetween at a central portion of a chip excluding regions of input/output cells. But in the recent master slice type semiconductor integrated circuit having the so-called sea of gates (or channel-less gate array), the basic cells are arranged in the entire central portion of the chip excluding the regions of the input/output cells, and logic unit cells and the interconnection channels are formed on the basic cells. According to this master slice type semiconductor integrated circuit having the sea of gates, it is possible to integrate a large number of gates because the interconnection channels can be reduced to a minimum.

When the integration density of the master slice type semiconductor integrated circuit increases by the use of the sea of gates, the circuit construction generally requires in addition to the logic unit cells random access memories (RAMs), read only memories (ROMs) and the like. For this reason, it is desirable that the master slice type semiconductor integrated circuit having the sea of gates has such a construction that the RAMs, ROMs and the like can be formed with ease from the basic cells in addition to the formation of the logic unit cells.

In the conventional master slice type semiconductor integrated circuit having the sea of gates, the basic cells are basically formed in a complementary metal oxide semiconductor (CMOS) structure for the formation of the logic unit cells. In other words, the basic cells are made of the same number of N-channel MOS transistors and P-channel MOS transistors.

FIG. 1 shows an example of the static RAM formed in the conventional master slice type semiconductor integrated circuit having the sea of gates. As shown, a latch circuit is constituted by N-channel MOS transistors N1 and N2 and P-channel MOS transistors P1 and P2, and a transmission gate is constituted by N-channel MOS transistors N3 and N4. WL denotes a word line, and BL and XBL denote bit lines. The numbers of N-channel MOS transistors and P-channel MOS transistors used in the static RAM are not the same. As a result, the utilization efficiency of the basic cells is poor when forming the static RAM in the semiconductor integrated circuit having the sea of gates.

In addition, when forming the ROM in the conventional master slice type semiconductor integrated circuit having the sea of gates, only N-channel MOS transistors are generally used with priority on the read-out speed of the ROM. In this case, only one-half portion of the basic cells, that is, only the N-channel MOS transistors, are used, thereby resulting in a poor utilization efficiency of the basic cells.

On the other hand, when the integration density of the master slice type semiconductor integrated circuit increases by the use of the sea of gates, there is a demand to integrate a programmable logic array (PLA) in the circuit in addition to the logic unit cells. The PLA has a two-level structure comprising ROMs in an AND plane and ROMs in an OR plane, and it is possible to generate various kinds of logic functions by use of a small number of transistors.

FIG. 2 shows an example of the conventional PLA. Input signals $A_i$ and $B_i$ are applied to terminals 1a and 1b. Signals $A_i$, $\overline{A}_i$, $B_i$ and $\overline{B}_i$ are supplied to input lines 3a, 3b, 4a and 4b, respectively. N-channel MOS transistors of an AND plane 6 are provided at intersections of the input lines 3a, 3b, 4a and 4b and product term lines 5a, 5b, 5c and 5d. In addition N-channel MOS transistors of an OR plane 8 are provided at intersections of the product term lines 5a, 5b, 5c and 5d and output lines 7a and 7b. Output signals $Z_1$ and $Z_2$ are output from terminals 2a and 2b. The programming is carried out by connecting drains of the N-channel MOS transistors of the AND plane 6 to the respective product term lines 5a through 5d and connecting drains of the N-channels MOS transistors of the OR plane 8 to the respective output lines 7a and 7b at positions encircled by phantom lines. $V_{DD}$ denotes a power source voltage, and $\phi_1$ and $\phi_2$ denote clock signals of mutually different phases.

However, the following problems occur when an attempt is made to form the PLA in the conventional master slice type semiconductor integrated circuit.

First, only N-channel MOS transistors are used on the AND plane 6 and the OR plane 8 with priority on the read-out speed, but in the conventional semiconductor integrated circuit having the sea of gates, the basic cells are basically formed in the CMOS structure for the formation of the logic unit cells. In other words, the basic cells are made of the same number of N-channel MOS transistors and P-channel MOS transistors. For this reason, when the PLA is formed by use of only the N-channel MOS transistors, the P-channel MOS transistors of the basic cells will not be used, and the utilization efficiency of the basic cells becomes poor.

Second, in the conventional master slice type semiconductor integrated circuit, a plurality of transistors are arranged in an X-direction (column direction) within the basic cell, for example, and gates thereof are connected in common. On the other hand, in the PLA, gates of the plurality of transistors arranged in the column direction or the AND plane 6 are connected in common, and gates of the plurality of transistors arranged in a row direction on the OR plane 8 are connected in common. Accordingly, when the input lines 3a through 4b are provided in the X-direction (column direction) of the basic cells of the semiconductor integrated circuit and the product term lines 5a through 5d are provided in a Y-direction (row direction) of the basic cells, only a single transistor of the basic cell can be used on the OR plane 8, thereby deteriorating the utilization efficiency of the basic cells.

For these reasons, the PLA is not formed in the conventional master slice type semiconductor integrated circuit.

SUMMARY OF THE INVENTION

Accordingly, it is a general object of the present invention to provide a novel and useful master slice type semiconductor integrated circuit having a sea of gates, in which the problems described heretofore are eliminated and the demands are satisfied.

Another and more specific object of the present invention is to provide a master slice type semiconductor integrated circuit which enables high utilization of basic cells when forming logic unit cells, RAMs, ROMs and the like in the semiconductor integrated circuit.

Still another object of the present invention is to provide a master slice type semiconductor integrated circuit which enables high utilization efficiency of basic cells when forming a PLA in the semiconductor integrated circuit.

A further object of the present invention is to provide a master slice type semiconductor integrated circuit comprising a semiconductor chip, input/output cells arranged in a peripheral portion of the semiconductor chip, and basic cells arranged in an entire central portion of the semiconductor chip excluding the peripheral portion of the semiconductor chip. Each of the basic cells are formed by a complementary metal oxide semiconductor (MOS) forming part and an N-channel metal oxide semiconductor (NMOS) forming part. The CMOS forming part forms a CMOS using the same number of P-channel metal oxide semiconductor (PMOS) transistors and NMOS transistors, while the NMOS forming part forms a plurality of NMOS transistors on at least one end of the CMOS forming part along a longitudinal direction of the CMOS forming part. According to the circuit of the present invention, the utilization efficiency of the basic cell is extremely high when forming the logic unit cell, the RAM, the ROM and the like. There is virtually no unused or wasted portion of the basic cell, thereby greatly improving the integration density of the semiconductor integrated circuit.

Another object of the present invention to provide a master slice type semiconductor integrated circuit which further comprises input lines, first and second product term lines, output lines, an AND plane and an OR plane of a programmable logic array. The AND plane is made up of a plurality of NMOS transistors of the basic cells located at intersections of the input lines and the first product term lines, and the OR plane is made up of a plurality of NMOS transistors of the basic cells located at intersections of the second product term lines and the output lines. The second product term lines are connected to the first product term lines. According to the circuit of the present invention, it is possible to form the PLA by the master slice type semiconductor integrated circuit by efficiently utilizing the basic cells. As a result, the field of application of the master slice type semiconductor integrated circuit is considerably expanded.

Other objects and further features of the present invention will be apparent from the following detailed description when read in conjunction with the accompanying drawings.

BRIEF DESCRIPTION OF THE DRAWINGS

FIGS. 9A and 9B respectively show arrangements of devices which may use the same interconnection;

FIGS. 10A and 10B are a wiring diagram and a circuit diagram respectively showing 1-port static RAM cells using the basic cells of the present embodiment;

FIG. 15 is a schematic diagram showing a portion of the ROM cells shown in FIGS. 14A and 14B;

FIGS. 16A and 16B are a plan view and an enlarged plan view respectively showing a modification of the basic cells;

Description of The Preferred Embodiment

Figure 1:
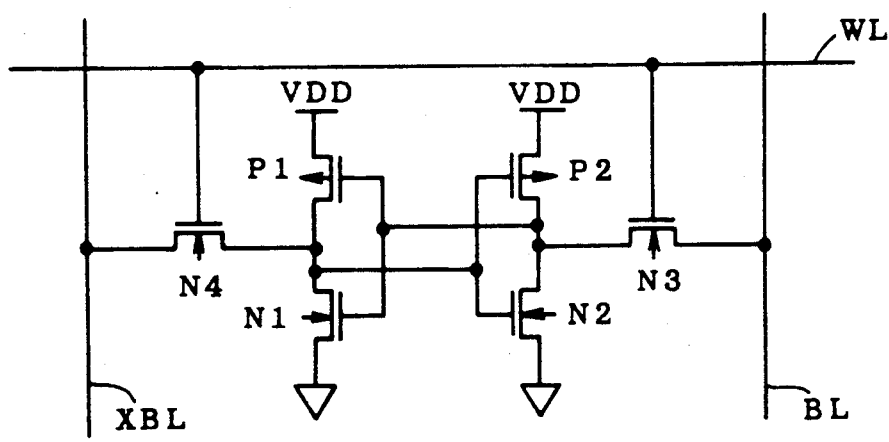
FIG. 1 is a circuit diagram showing an example of the static RAM formed in the conventional master slice type semiconductor integrated circuit having the sea of gates.
Figure 2:
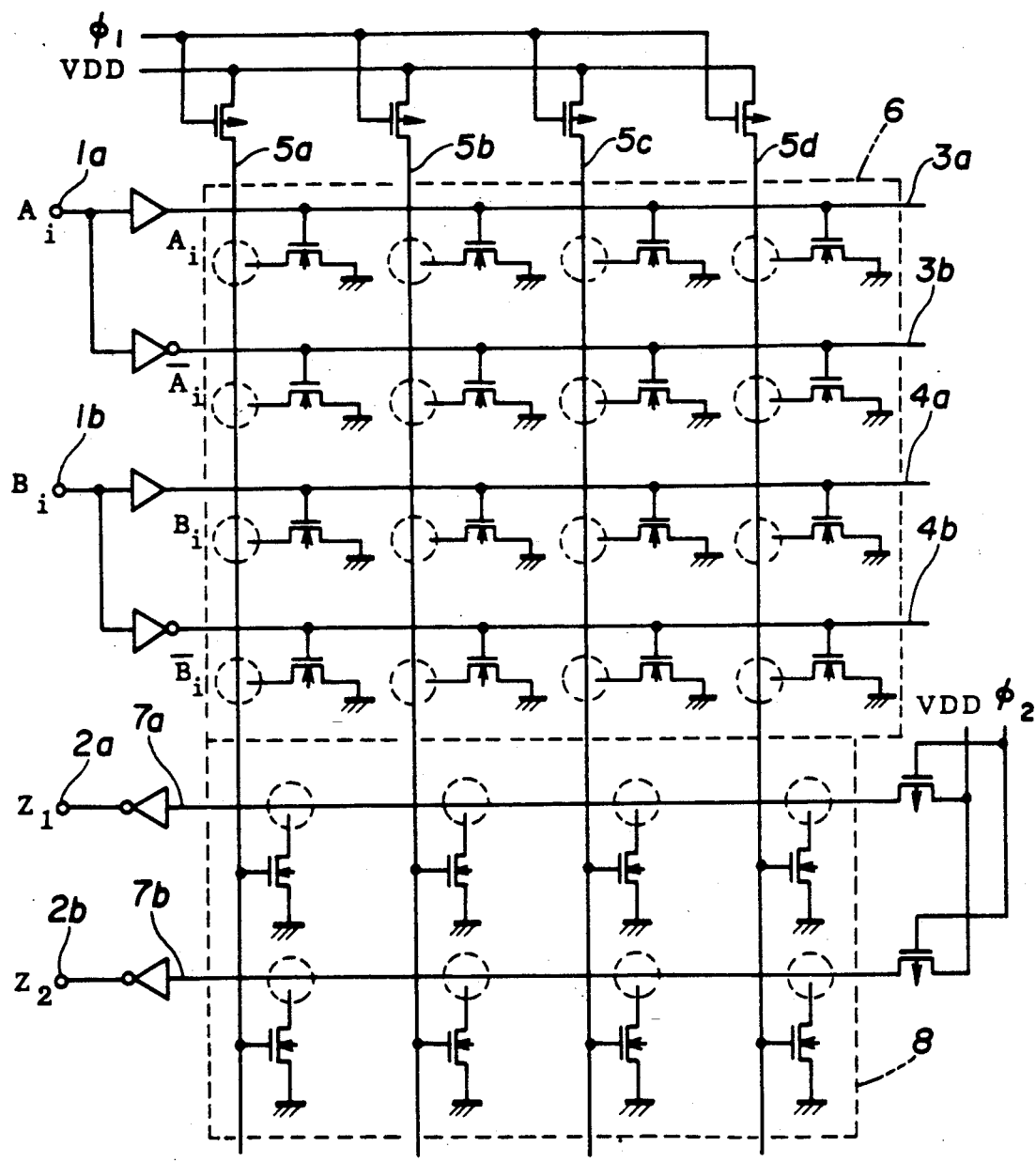
FIG. 2 is a circuit diagram showing an example of the PLA.
Figure 3:
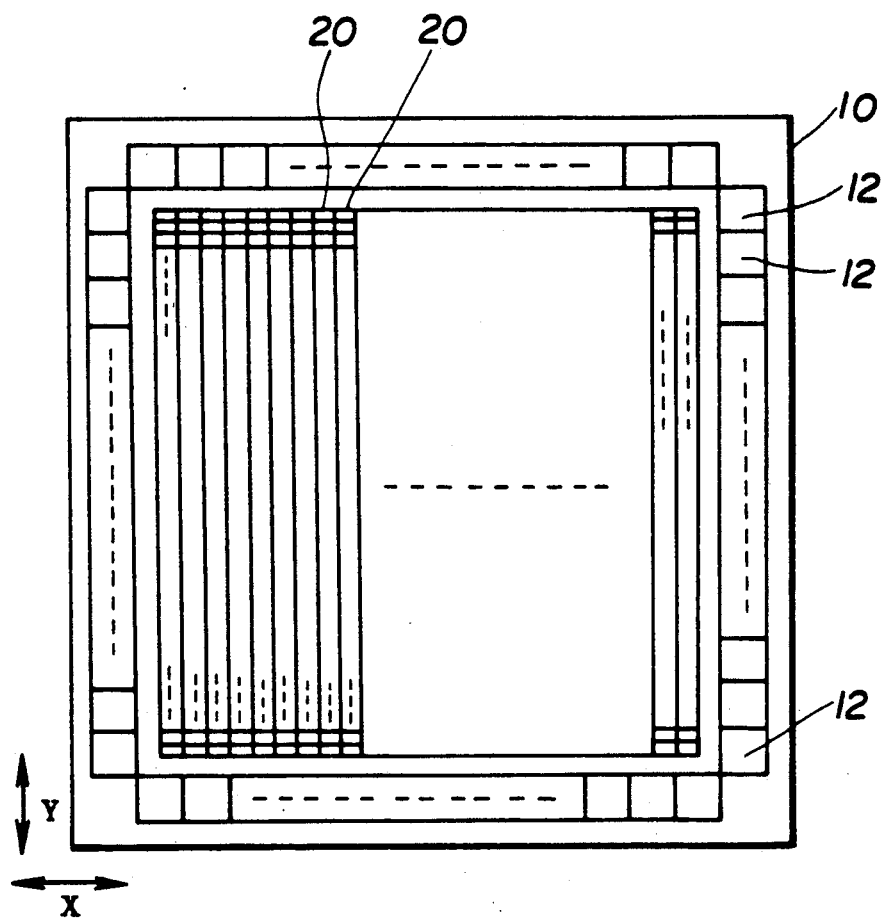
FIG. 3 is a plan view generally showing an embodiment of the master slice type semiconductor integrated circuit according to the present invention.

FIG. 3 generally shows an embodiment of the master slice type semiconductor integrated circuit according to the present invention. A semiconductor chip 10 comprises a plurality of input/output cells 12 provided in a peripheral portion of the chip 10 and a plurality of basic cells 20 provided in a central portion of the chip 10.

Figure 4:
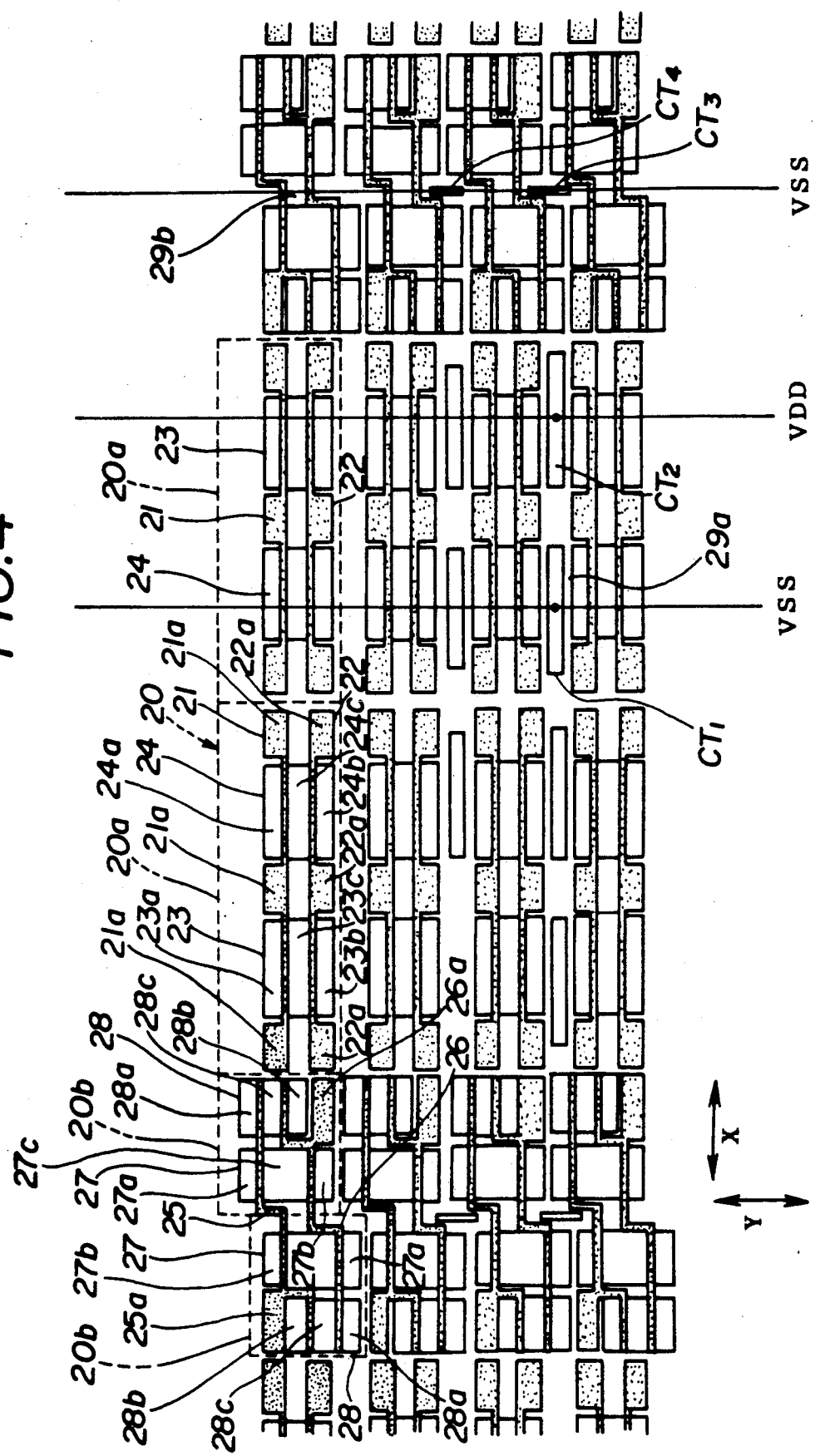
FIGS. 4 and 5 are plan views showing an embodiment of the basic cells of the embodiment on an enlarged scale.
Figure 5:
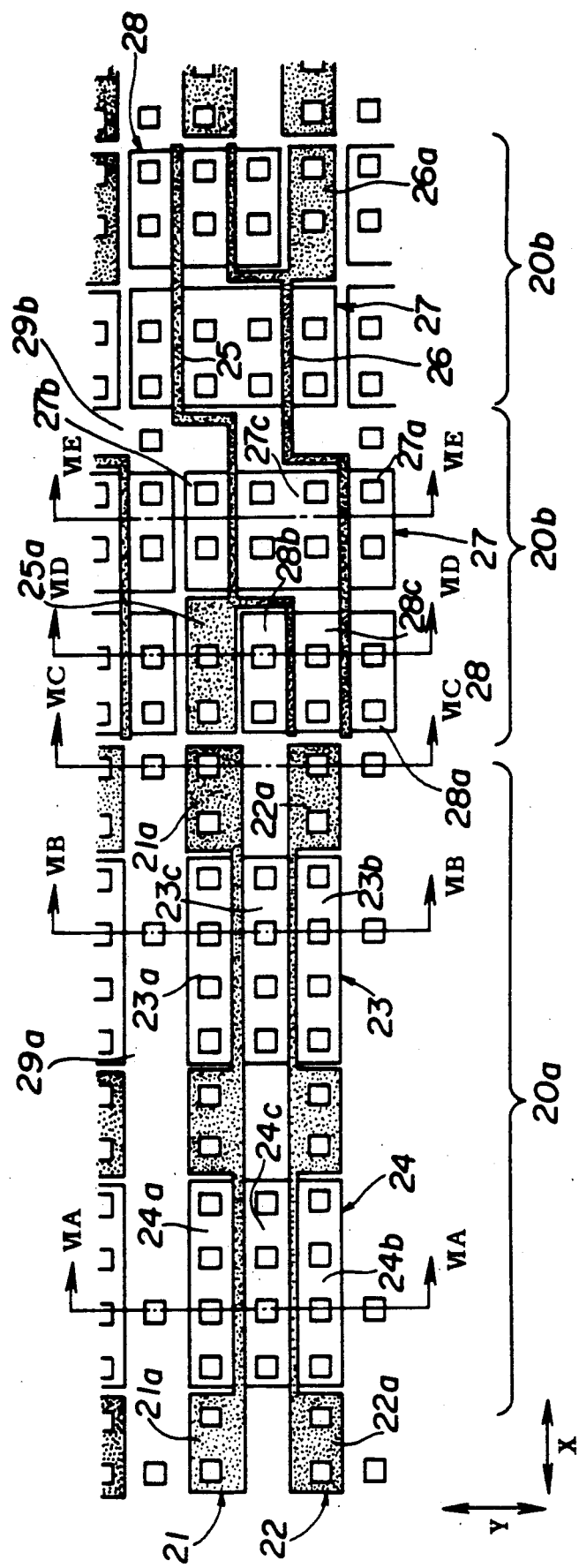
Figure 6A:
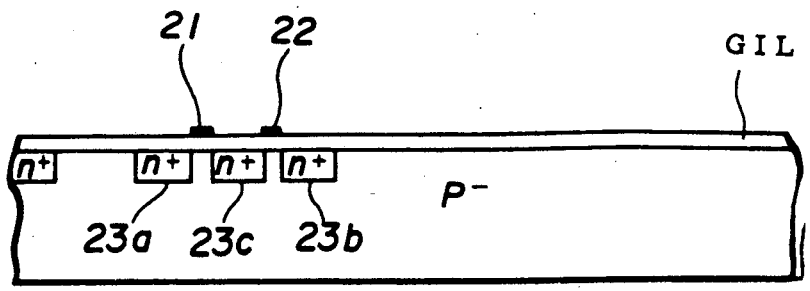
FIGS. 6A through 6E are cross sectional views showing the basic cells along lines VIA-VIA, VIB-VIB, VIC-VIC, VID-VID and VIE-VIE in FIG. 5, respectively.
Figure 6B:
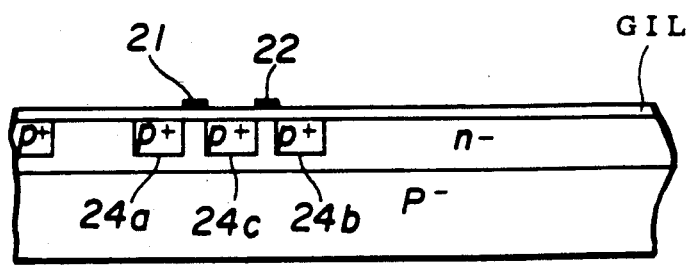
Figure 6C:
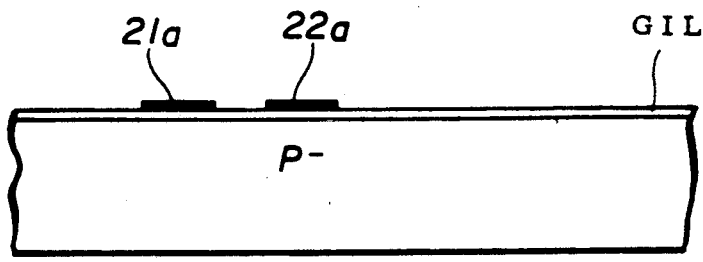
Figure 6D:
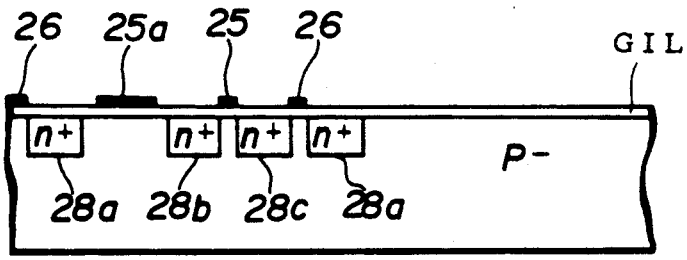
Figure 6E:
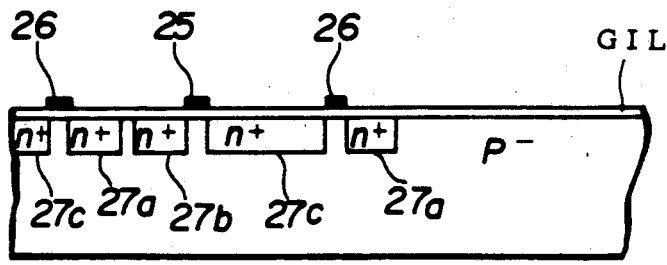

FIGS. 4 and 5 show an embodiment of the basic cells of the embodiment on an enlarged scale. FIGS. 4 and 5 shows the so-called master on which no aluminum interconnection (wiring) has been formed. In the master slice type semiconductor integrated circuit, the master which is prepared is already formed with gate electrodes, and the aluminum interconnection is formed on an upper layer of the master depending on the needs of the user. In FIG. 4, $V_{DD}$ and $V_{SS}$ denote first and second power source voltages. In the present embodiment, $V_{SS}$ denotes the ground voltage.

In FIGS. 4 and 5, the basic cell 20 comprises a CMOS forming part 20a and an N-channel MOS (hereinafter simply referred to as an NMOS) forming part 20b. The CMOS forming part 20a is formed by gate electrodes 21 and 22 indicated by a shading, a P-channel MOS (hereinafter simply referred to as a PMOS) part 23, and an NMOS part 24. The PMOS part 23 comprises P-channel portions 23a, 23b and 23c, and two PMOS transistors are formed using the P-channel portion 23c in common. The NMOS part 24 comprises N-channel portions 24a, 24b and 24c, and two NMOS transistors are formed using the N-channel portion 24c in common. The gate electrodes 21 and 22 respectively have wide portions 21a and 22b for connecting the interconnection on the upper layer in a slicing process.

The NMOS forming part 20b is formed by gate electrodes 25 and 26 indicated by a shading, and NMOS parts 27 and 28. The NMOS part 27 comprises N-channel portions 27a, 27b and 27c, while the NMOS part 28 comprises N-channel portions 28a, 28b and 28c. Two NMOS transistors are formed in the NMOS part 27 by using the N-channel portion 27c in common, and two NMOS transistors are formed in the NMOS part 28 by using the N-channel portion 28c in common.

The gate electrodes 21, 22, 25 and 26 are made of polysilicon and are formed integrally.

FIGS. 6A through 6E are cross sectional views of the basic cell along lines VIA-VIA, VIB-VIB, VIC-VIC, VID-VID and VIE-VIE in FIG. 5, respectively. In FIGS. 6A through 6E, GIL denotes a gate insulator layer made of silicon dioxide ($SiO_2$), for example.

The width of the N-channel portion 27c in the Y-direction is two times that of the N-channel portion 28c, and two connecting portions can be provided both in the X and Y directions. When there is a need to connect the NMOS part 28 and the CMOS part 20a by a first layer aluminum interconnection and connect the NMOS part 27 and the CMOS part 20a by a second layer aluminum interconnection, for example, it is necessary to have a first connecting portion for connecting the N-channel portion 27c to the first layer aluminum interconnection and a second connecting portion for connecting the first layer aluminum interconnection to the second layer aluminum interconnection in order to connect the N-channel portion 27c to the second layer aluminum interconnection. In this case, when the first and second connecting portions are arranged in the Y-direction, it is possible to provide other interconnections such as bit lines on the remaining connecting portions arranged in the X-direction. In other words, it is possible to reduce the overall width of the basic cell 20 in the X-direction without the need to increase the width of the NMOS part 27 in the X-direction.

The gate electrodes 25 and 26 are formed by common electrodes which are integral parts of gates of the NMOS forming part 20b of the basic cell 20 which is adjacent on the left side of the gate electrodes 25 and 26 in the X-direction. These gate electrodes 25 and 26 are provided with wide portions 25a and 26a, respectively. The two mutually adjacent NMOS forming parts 20b are symmetrical about a point on a boundary between the two in a state where the two are shifted in the Y-direction.

The CMOS forming parts 20a of the basic cells 20 adjacent to each other in the X-direction are symmetrical about a boundary line between the two.

Thus, a plurality of the basic cells 20 are arranged in the X and Y directions in the entire central portion of the chip 10 as shown in FIG. 3, excluding the regions of the input/output cells 12.

A portion 29a is formed between the basic cells 20 adjacent to each other in the Y-direction, and a portion 29b is formed between the NMOS forming parts 20b (of the basic cells 20) adjacent to each other in the X-direction. The portions 29a and 29b are provided for making contacts to a substrate of the chip 10.

For convenience' sake, FIG. 4 only shows some of the contacts provided in the portions 29a and 29b. A contact $CT_1$ is provided in the portion 29a for supplying the power source voltage $V_{SS}$ to the NMOS transistors in the CMOS forming part 20a. Similarly, a contact $CT_2$ is provided in the portion 29a for supplying the power source voltage $V_{DD}$ to the PMOS transistors in the CMOS forming part 20a. Contacts $CT_3$ and $CT_4$ are provided in the portion 29b for supplying the power source voltage $V_{SS}$ to the transistors of the NMOS forming part 20b. To simplify the figure, the interconnections for supplying the power source voltages $V_{SS}$ and $V_{DD}$ are illustrated as lines.

In FIG. 5, rectangular marks indicate positions where a connection can be made with the aluminum interconnection.

Figure 7B:
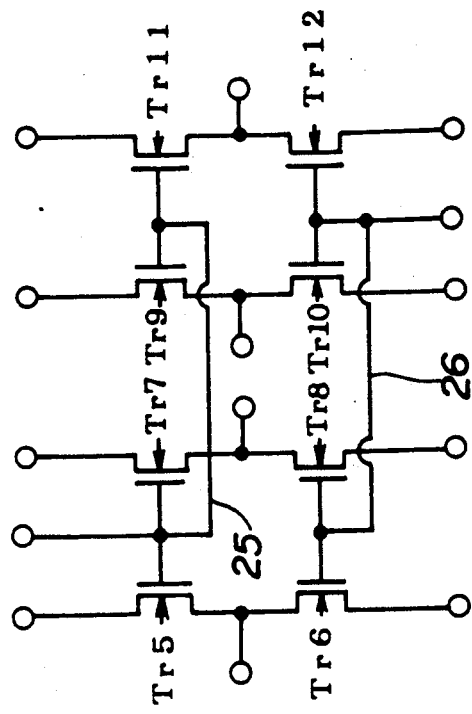
FIGS. 7A and 7B are circuit diagrams respectively showing equivalent circuits of a CMOS forming part of the basic cells and mutually adjacent NMOS forming parts of the basic cells.
Figure 7A:
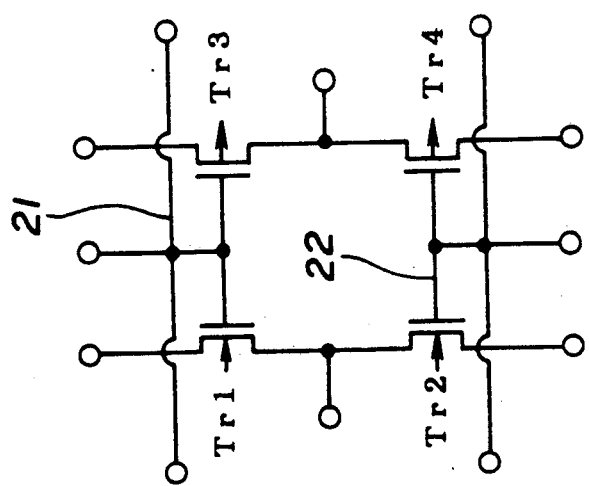

FIGS. 7A and 7B show equivalent circuits of parts of the basic cell shown in FIG. 5. FIG. 7A shows an equivalent circuit of the CMOS forming part 20a. In FIG. 7A, transistors Tr1 and Tr2 are NMOS transistors of the NMOS part 24, and transistors Tr3 and Tr4 are PMOS transistors of the PMOS part 23. On the other hand, FIG. 7B shows an equivalent circuit of the pair of mutually adjacent NMOS forming parts 20b. In FIG. 7B, transistors Tr5, Tr6, Tr11 and Tr12 are NMOS transistors of the NMOS part 28, and transistors Tr7, Tr7, Tr9 and Tr10 are NMOS transistors of the NMOS part 27.

Figures 8A, 8B, 8C, 8D:
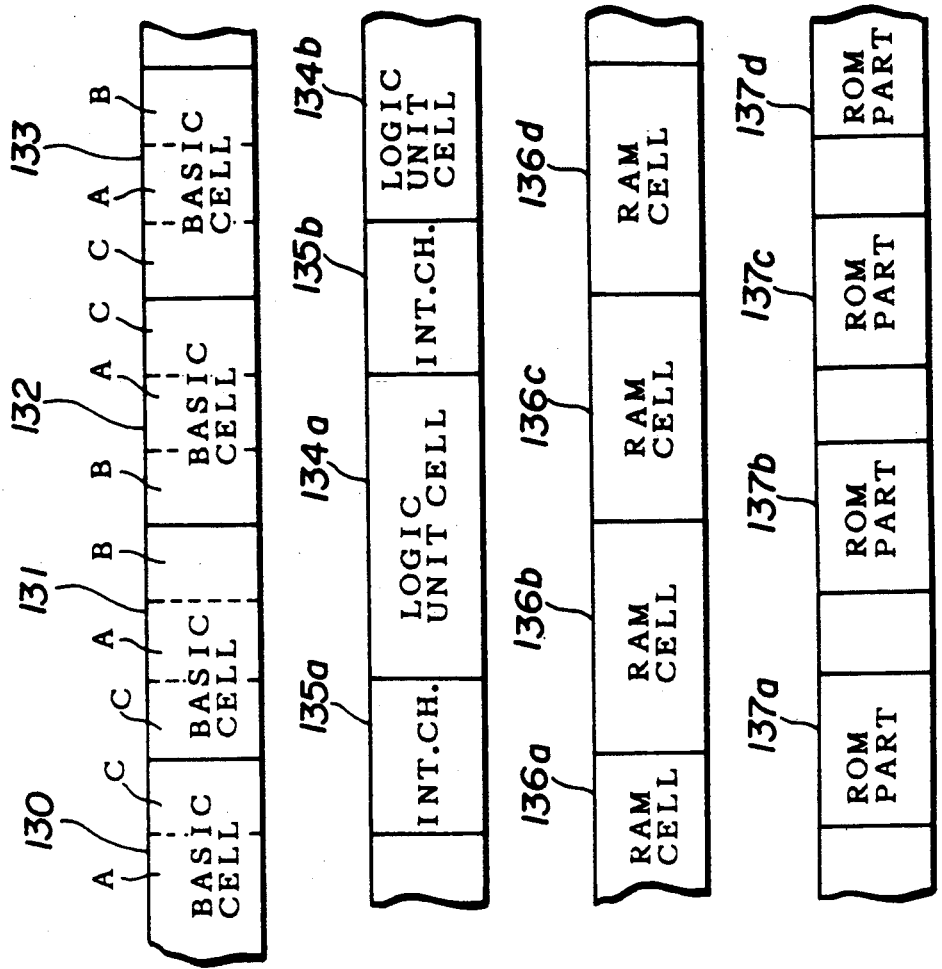
FIG. 8A schematically shows a row of basic cells.
FIG. 8B schematically shows logic unit cells formed by use of the basic cells shown in FIG. 8A.
FIG. 8C schematically shows a RAM formed by use of the basic cells shown in FIG. 8A.
FIG. 8D schematically shows a ROM formed by use of the basic cells shown in FIG. 8A.

FIG. 8A shows a row of basic cells 130, 131, 132 and 133 in the Y-direction. In FIG. 8A, A and B respectively indicate the PMOS part 23 and the NMOS part 24 of the CMOS forming part 20a shown in FIG. 3, and C indicates the NMOS forming part 20b.

When forming logic unit cells of the CMOS by use of the basic cells 130 through 133, logic unit cells 134a and 134b are formed from the CMOS forming parts A and B as shown in FIG. 8B, and the NMOS forming parts C are used as interconnection channels 135a and 135b.

When forming a RAM, RAM cells 136a through 136d are formed from the basic cells 130 through 133, respectively, as shown in FIG. 8C.

When forming a ROM, ROM parts 137a through 137d are formed in the NMOS parts B and C as shown in FIG. 8D. The ROM parts 137a through 137d have a plurality of cells in each of the NMOS parts B and C, and the CMOS part A is not used.

There is no need to provide the interconnection channels when forming the RAM and the ROM shown in FIGS. 8C and 8D.

As described before, the two mutually adjacent NMOS forming parts 20b are symmetrical about the point on the boundary between the two in the state where the two are shifted in the Y-direction, and further, the CMOS forming parts 20a of the basic 20 adjacent to each other in the X-direction are symmetrical about the boundary line between the two. For this reason, when the interconnection is designed automatically in computer aided design (CAD) for a device having an arrangement shown in FIG. 9A, the same interconnection can be used for a device having an arrangement shown in FIG. 9B, for example, by rotating the interconnection 180°. In FIGS. 9A and 9B, CCT$_1$ and CCT$_2$ denote circuit parts formed by the basic cells. Hence, it is unnecessary to re-design the interconnection for the arrangement shown in FIG. 9B, and it is easier to meet the user's demands.

In the case of the RAM, for example, the number of terminals becomes extremely large when the number of bits is large, and it would be both time consuming and troublesome to design interconnections for every user's needs. But according to the present embodiment, it is possible to use the same interconnection for arrangements having a certain relationship such as that of FIGS. 9A and 9B. In addition, when making a dual port RAM, for example, it is only necessary to design one kind of interconnection for the peripheral circuits such as the address decoder. The interconnection used for the address decoder provided with respect to one of the two ports can be rotated and used for the address decoder provided with respect to the other of the two ports.

FIGS. 10A and 10B are a wiring diagram and a circuit diagram of 1-port static RAM cells using the basic cells of the present embodiment.

In FIG. 10A and the wiring diagrams shown in FIGS. 12A and 14A which will be described later, the illustration of the gate electrode is omitted for convenience' sake, and the connecting positions of the interconnection corresponds to the rectangular mark in FIG. 5. Furthermore, a hatching indicates a first layer aluminum interconnection and a shading indicates a second layer aluminum interconnection.

The P-channel portion 23c and the N-channel portion 24c of the respective PMOS part 23 and the NMOS part 24 in FIG. 10A are respectively connected to the power source voltages V$_{DD}$ and V$_{SS}$ at connecting portions C11 and C12. Hence, a latch circuit LAT shown in FIG. 10B formed by the CMOS forming part 20a is driven by the power source voltages V$_{DD}$ and V$_{SS}$. The latch circuit LAT comprises PMOS transistors P1 and P2 and NMOS transistors N1 and N2.

The NMOS parts 28 and 27 of the NMOS forming part 20b respectively form transmission gates N3 and N4, and gates of these transmission gates N3 and N4 are connected to a word line WL1 at the connecting portion C1. The N-channel portions 27a and 27b are connected to a bit line XBL3 at a connecting portion C2, and the N-channel portions 28a and 28b are connected to a bit line BL3 at a connecting portion C3. The N-channel portions 27c and 28c are connected to the latch circuit LAT at respective connecting portions C4 and C5.

Therefore, the 1-port static RAM cell amounting to one bit is formed by using all of the basic cell 20.

Figures 11A, 11B:
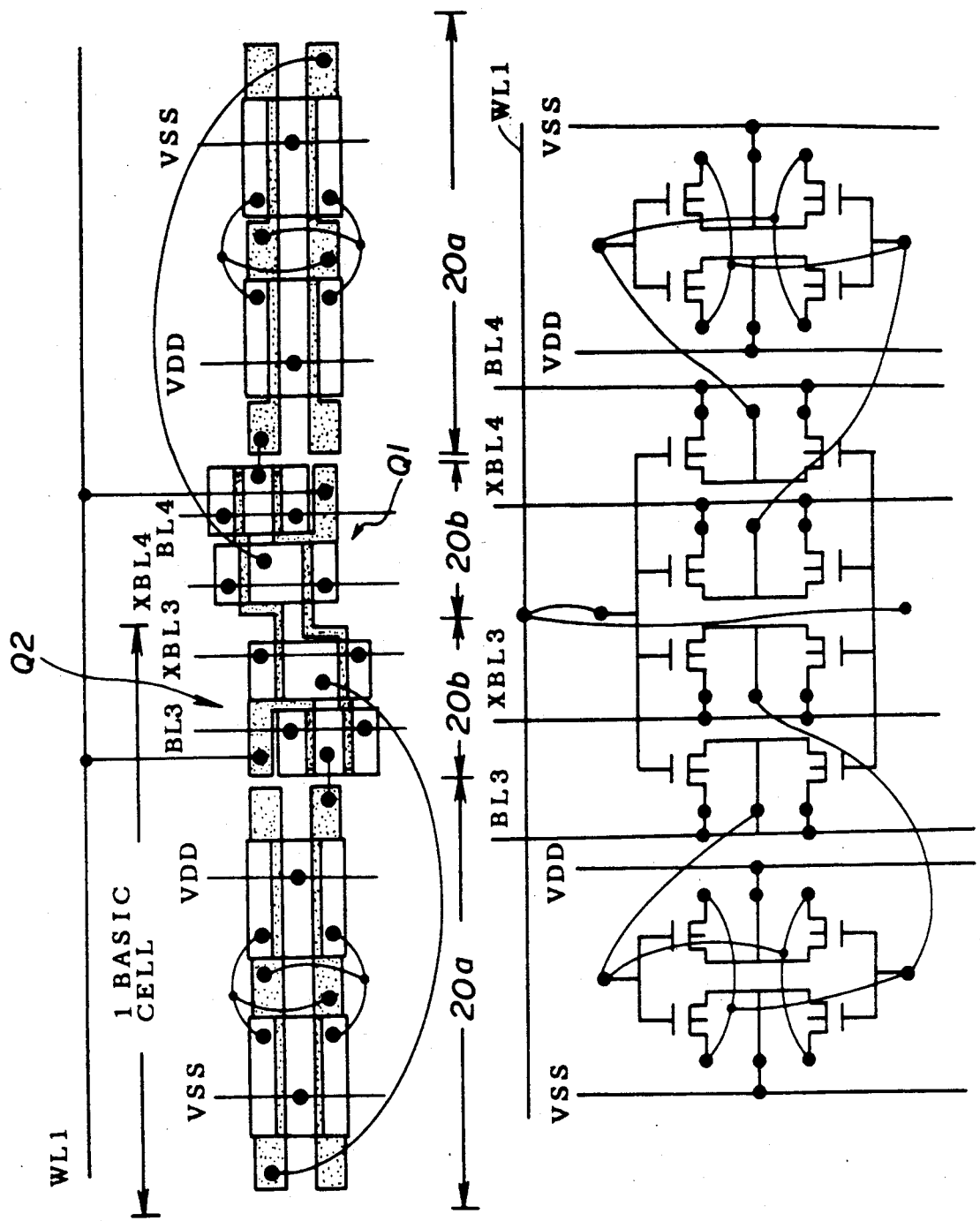
FIGS. 11A and 11B are a schematic diagram and a circuit diagram respectively showing a portion of the 1-port static RAM cells shown in FIGS. 10A and 10B, FIGS. 12A and 12B are a wiring diagram and a circuit diagram of 2-port static RAM cells using the basic cells of the present embodiment.

The actual pattern shown in FIG. 10A is complex and hence difficult to understand. FIG. 11A shows a portion of the pattern shown in FIG. 10A with the connections indicated by lines so as to facilitate the understanding of FIG. 10A. FIG. 11B is a circuit diagram showing the equivalent circuit of FIG. 11A. In FIGS. 11A and 11B, those parts which are the same as those corresponding parts in FIGS. 10A and 10B are designated by the same reference numerals, and a description thereof will be omitted.

In FIGS. 10A and 11A, the transistors formed at a location Q1 is shifted upwardly in the figures compared to the transistors formed at a location Q2, thereby preventing the increase in the space occupied by the transistors in the horizontal direction in the figures. The portion 29a essentially formed by the vertical positional difference between the locations Q1 and Q2 is effectively used for providing the contact as described before in conjunction with FIG. 4.

Figure 12A:
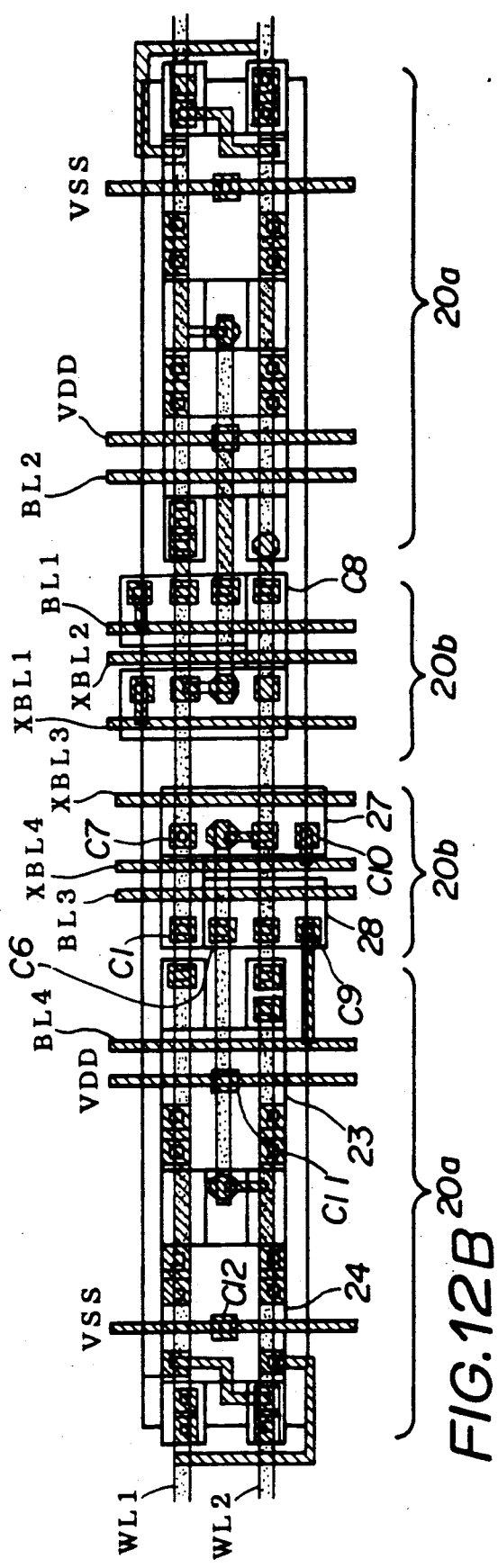
Figure 12B:
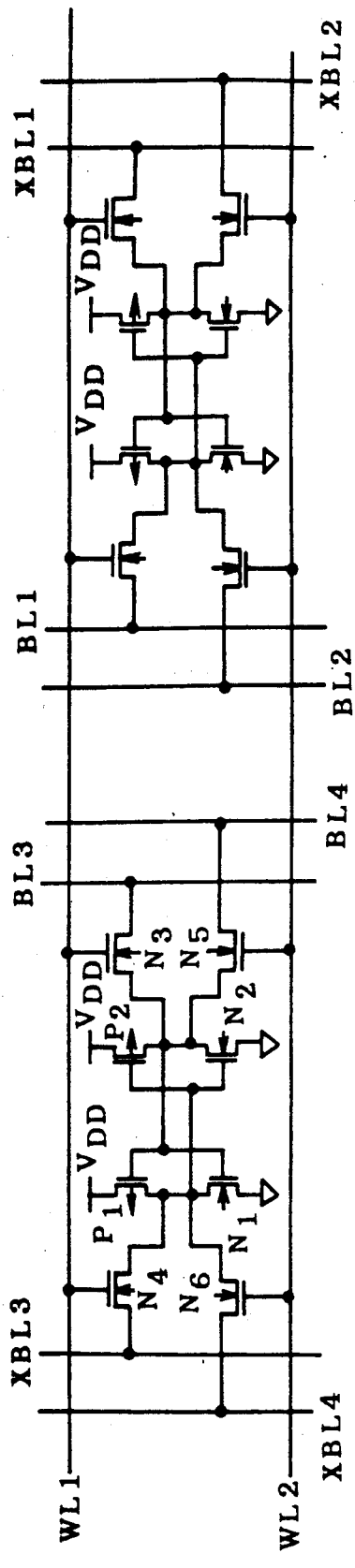

FIGS. 12A and 12B are a wiring diagram and a circuit diagram of 2-port static RAM cells using the basic cells of the present embodiment.

FIGS. 12A and 12B differ from FIGS. 10A and 10B in the following respects. That is, two word lines WL1 and WL2 are provided, and four bit lines BL3, XBL3, BL4 and XBL4 are provided for one bit. The gates of the transmission gates N3 and N4 formed in the respective NMOS parts 28 and 27 are connected in common to the word line WL1 at the connecting portion C1. The N-channel portions 28b and 27b of the NMOS parts 28 and 27 are connected to the bit lines BL3 and XBL3 at respective connecting portions C6 and C7. In addition, gates of transmission gates N5 and N6 are connected in common to the word line WL2 at a connecting portion C8, and the N-channel portions 28a and 27a of the NMOS parts 28 and 27 are connected to the bit lines BL4 and XBL4 at respective connecting portions C9 and C10.

Therefore, the 2-port static RAM cell amounting to one bit is formed by using all of the basic cell 20.

Figure 13A:
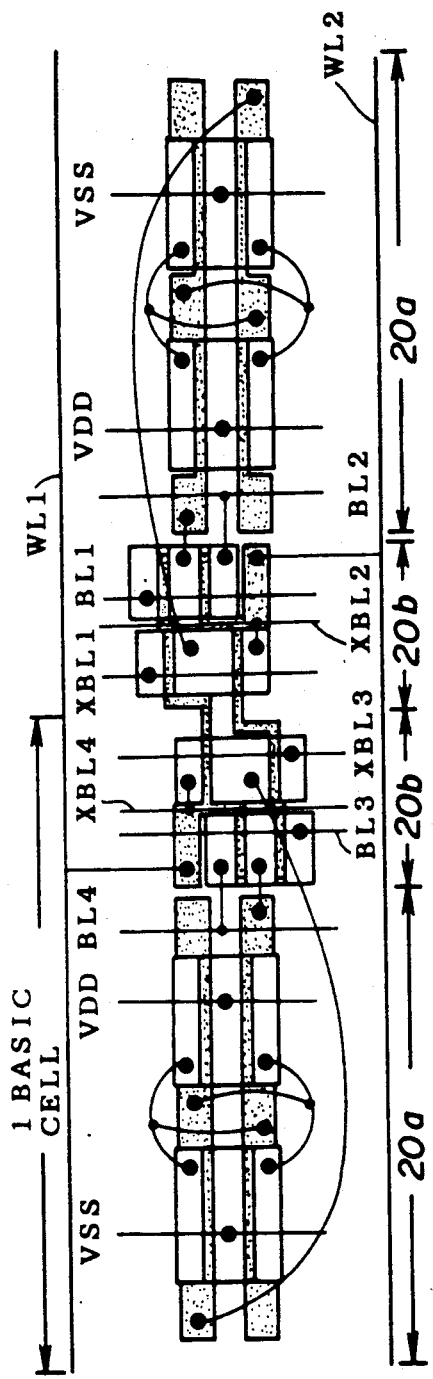
FIGS. 13A and 13B are a schematic diagram and a circuit diagram respectively showing a portion of the 2-port static RAM cells shown in FIGS. 12A and 12B.
Figure 13B:
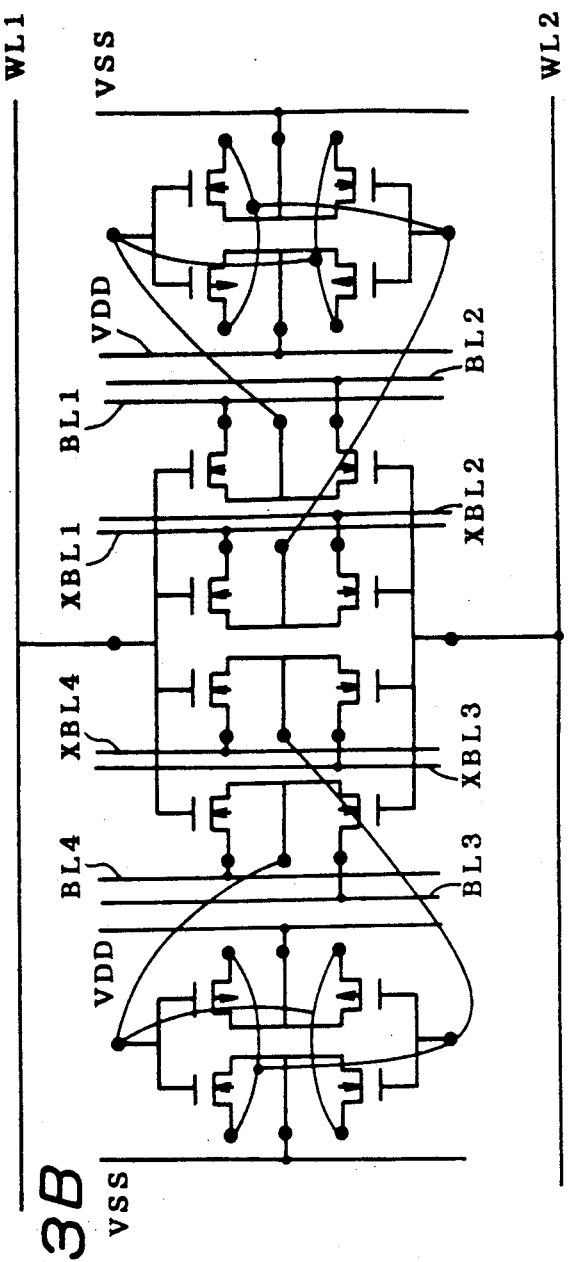

The actual pattern shown in FIG. 12A is complex and hence difficult to understand. FIG. 13A shows a portion of the pattern shown in FIG. 12A with the connections indicated by lines so as to facilitate the understanding of FIG. 12A. FIG. 13B is a circuit diagram showing the equivalent circuit of FIG. 13A. In FIGS. 13A and 13B, those parts which are the same as those corresponding parts in FIGS. 12A and 12B are designated by the same reference numerals, and a description thereof will be omitted.

Figure 14A:
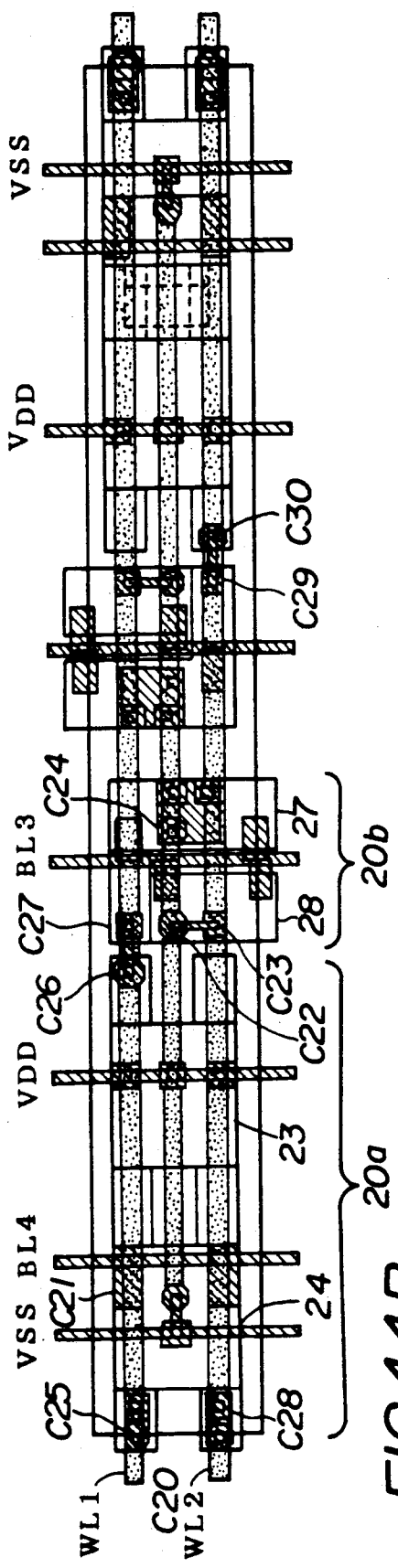
FIGS. 14A and 14B are a wiring diagram and a circuit diagram of ROM cells using the basic cells of the present embodiment.
Figure 14B:
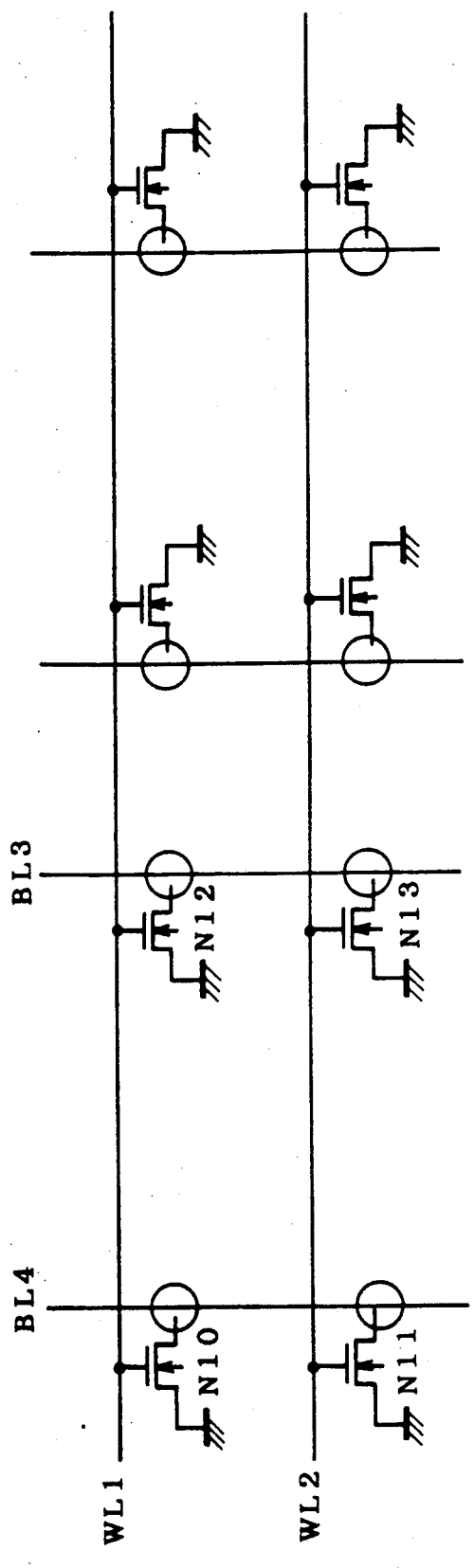

FIGS. 14A and 14B are a wiring diagram and a circuit diagram of ROM cells using the basic cells of the present embodiment.

Sources of NMOS transistors N10 and N11 formed by the NMOS part 24 and sources of NMOS transistors N12 and N13 formed by the NMOS parts 27 and 28 (that is, the N-channel portions 24c, 27c and 28c) are connected in common to the power source voltage V$_{SS}$ at connecting portions C20 through C24. In addition, P-channel portions 23a, 23b and 23c of the PMOS part 23 are connected to the power source voltage V$_{DD}$ so that the PMOS transistor will not operate.

The gates of the NMOS transistors N10 and N12 are connected to the word line WL1 at connecting portions C25 through C27. The NMOS transistors N11 and N13 are connected to the word line WL2 at connecting portions C28 through C30. The ROM cell is programmed depending on whether or not drains of the NMOS transistors N10 and N11 (N-channel portions 24a and 24b) are connected to the bit line BL4 and whether or not drains of the NMOS transistors N12 and N13 (N-channel portions 27a, 27b, 28a and 28b) are connected to the bit line BL3. In other words, the ROM cell is programmable.

Figure 19:
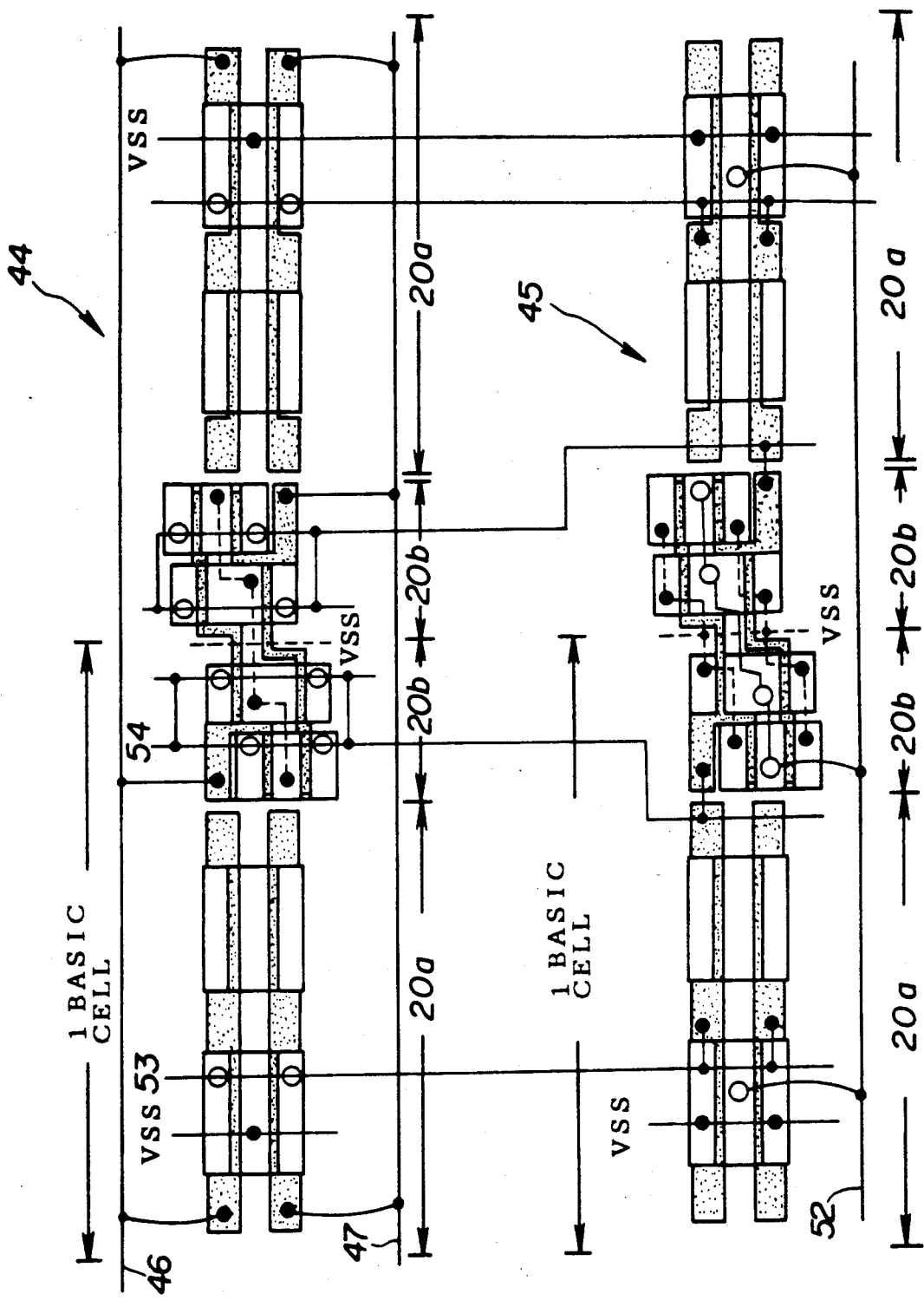
FIG. 19 is a schematic diagram showing a portion of the PLA shown in FIGS. 17 and 18.
Figure 22A:
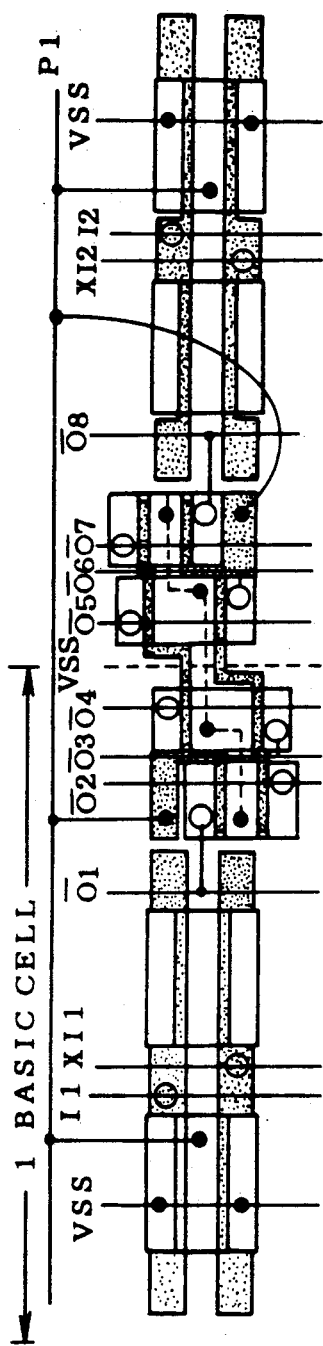
FIGS. 22A and 22B are a schematic diagram and a circuit diagram showing a portion of a fourth embodiment of the PLA.

The actual pattern shown in FIG. 14A is complex and hence difficult to understand. FIG. 15 shows a portion of the pattern shown in FIG. 14A with the connections indicated by lines so as to facilitate the understanding of FIG. 14A. In FIG. 15, those parts which are the same as those corresponding parts in FIGS. 14A and 14B are designated by the same reference numerals, and a description thereof will be omitted. In FIG. 15 and FIGS. 19 and 22A which will be described later, circular marks other than the black circular marks denote program contacts where a contact can be made depending on the programming which is carried out.

Therefore, when using the basic cells 20 to form logic unit cells, the unused NMOS forming part 20b which is not used for the logic unit cells can be effectively utilized as the interconnection channels. When forming the RAM, 100% of the basic cell 20 can be used, and there is no unused or wasted portions of the basic cell 20. When forming the ROM, virtually all of the basic cell can be used except for the PMOS part 23. Hence, the utilization efficiency of the basic cells 20 is extremely high according to the present embodiment.

Figure 16B:
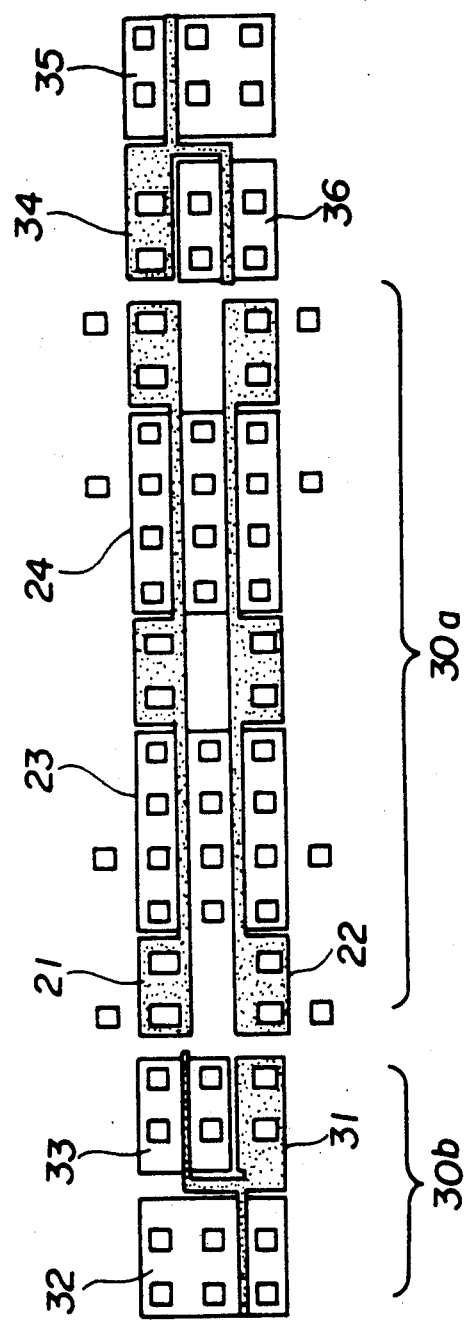

FIGS. 16A and 16B are a plan view and an enlarged plan view respectively showing a modification of the basic cells. In FIGS. 16A and 16B, a basic cell 30 comprises a CMOS forming part 30a, and NMOS forming parts 30b and 30c. The CMOS forming part 30a has the same construction as the CMOS forming part 20a shown in FIG. 3 through 5. In FIG. 16B, rectangular marks indicate positions where a connection can be made with the aluminum interconnection.

The NMOS forming parts 30b and 30c arranged on the left and right of the CMOS forming part 30a in the Y-direction are essentially the NMOS forming part 20b of FIGS. 3 through 5 divided into two. The NMOS forming part 30b comprises a gate 31 indicated by a shading, and NMOS parts 32 and 33. The NMOS forming part 30c comprises a gate 34 indicated by a shading, and NMOS parts 35 and 36. The NMOS forming part 30b and the NMOS forming part 30c adjacent on the left thereof in the X-direction are point symmetrical about a point on a boundary between the two. The gates 31 and 34 are formed by common integrally formed electrodes.

The logic unit cell, the RAM cell, the ROM cell and the like can be formed by use of the basic 9E cell 20, with a similar utilization efficiency to that of the embodiment described before.

Therefore, according to the described embodiment and modification, the utilization efficiency of the basic cell is extremely high when forming the logic unit cell, the RAM, the ROM and the like. There is virtually no unused or wasted portion of the basic cell, thereby greatly improving the integration density of the semiconductor integrated circuit.

Figure 17:
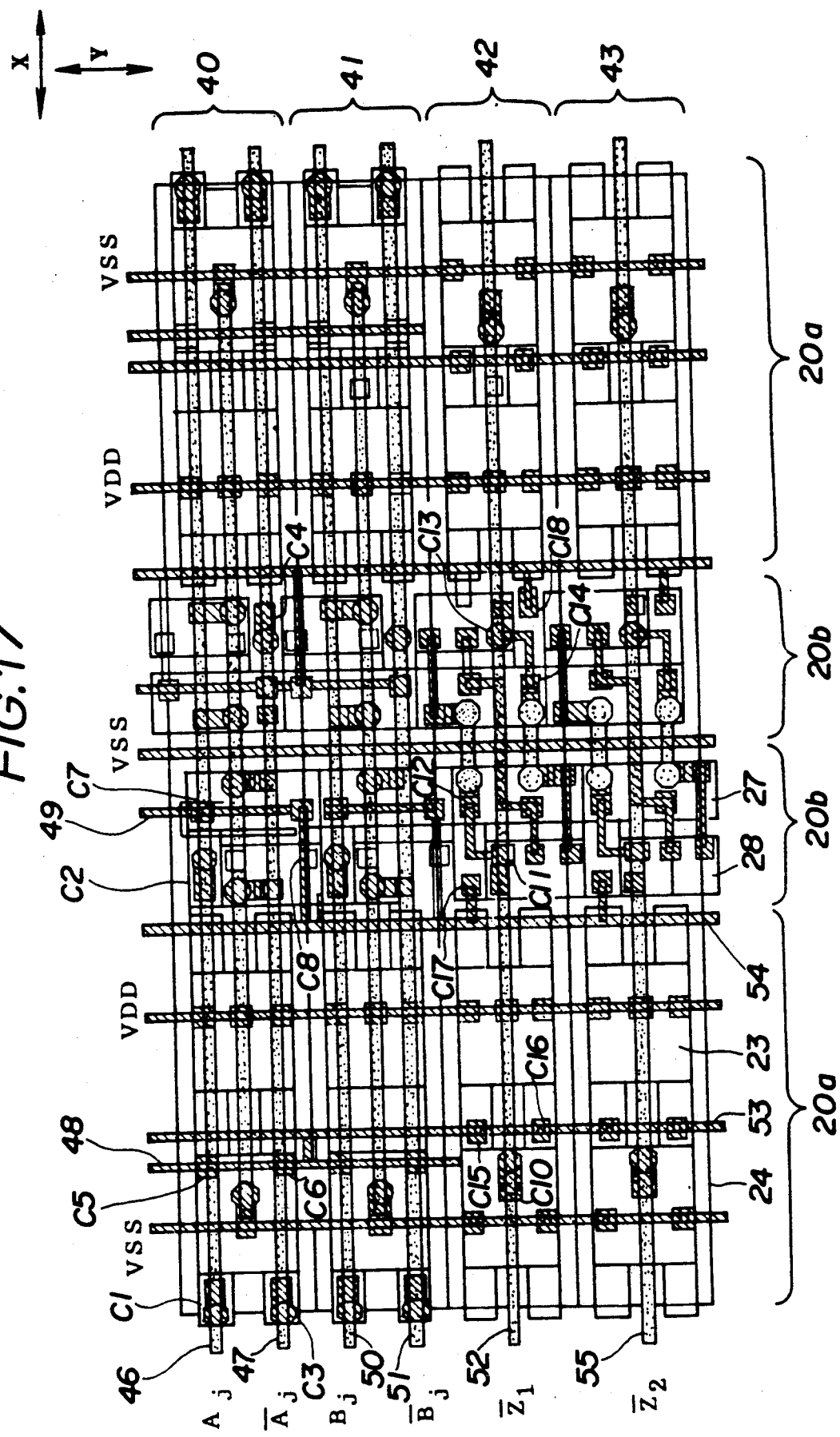
FIGS. 17 and 18 are a wiring diagram and a circuit diagram respectively showing a first embodiment of the PLA.
Figure 18:
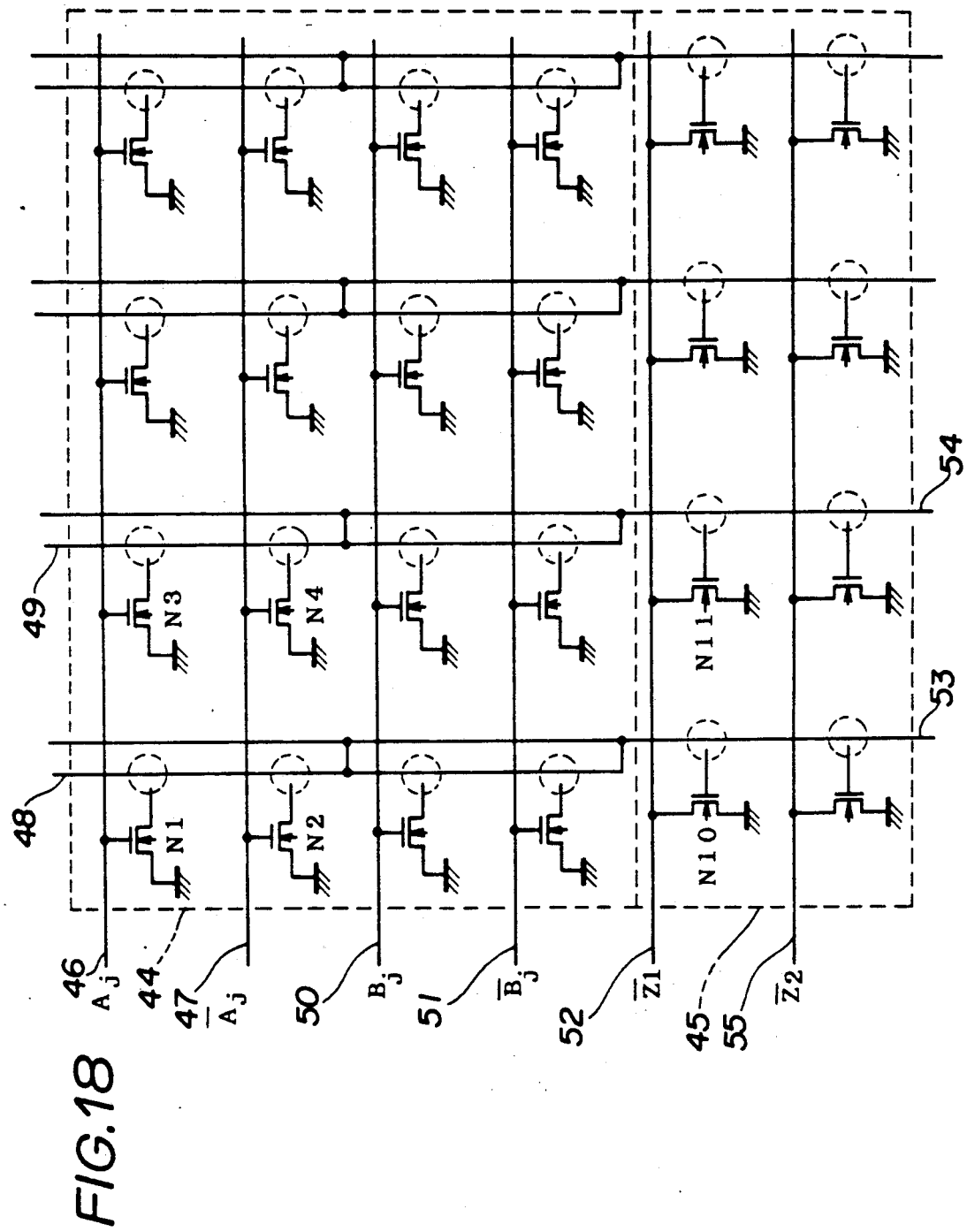

Next, a description will be given on the formation of a programmable logic array (PLA) by use of the basic cells. FIGS. 17 and 18 are a wiring diagram and a circuit diagram respectively showing a first embodiment of the PLA. In FIGS. 17 and 18, those parts which are the same as those corresponding parts in FIGS. 3 through 5 are designated by the same reference numerals, and a description thereof will be omitted. In addition, the illustration of the gate electrode is omitted for convenience' sake, and the connecting position of the interconnection corresponds to the rectangular mark in FIG. 5.

In FIG. 17, a hatching indicates a first layer aluminum interconnection (wiring), and a shading indicates a second layer aluminum interconnection (wiring). In addition, a first column 40 of the basic cells 20 and a second column 41 of the basic cells 20 form an AND plane 44 (see FIG. 18.), while a third column 42 of the basic cells 20 and a fourth column 43 of the basic cells 20 form an OR plane 45 (see FIG. 18).

In the first column 40, the P-channel portions 23a, 23b and 23c of the PMOS part 23 are connected to the power source voltage $V_{DD}$ so that the PMOS transistor does not operate. On the other hand, N-channel portions 24c, 27c and 28c of the respective NMOS parts 24, 27 and 28 are connected to the power source voltage $V_{SS}$.

An input line 46 which extends in the X-direction and receives a signal $A_j$ is connected to the gate electrodes 21 and 25 at the connecting portions C1 and C2. An input line 47 which extends in the X-direction and receives a signal $\overline{A_j}$ is connected to the gate electrodes 22 and 26 at the connecting portions C3 and C4. Accordingly, the two NMOS transistors N1 and N2 shown in FIG. 18 are formed at the N-channel portions 24a and 24c and N-channel portions 24b and 24c of the NMOS part 24. Furthermore, the two NMOS transistors N3 and N4 are formed at the N-channel portions 27b, 28b, 27c and 28c of the NMOS parts 27 and 28 and the N-channel portions 27a, 28a, 27c and 28c of the N-channel parts 27 and 28.

Product term lines 48 and 49 are provided on the respective NMOS parts 24 and 27 and extend in the Y-direction. The programming of the PLA is carried out by connecting the drains of the NMCS transistors N1 through N4 to the product term lines 48 and 49 at the connecting portions C5 through C8. In FIG. 18, portions where the programming is carried out are encircled by phantom lines.

The arrangement is similar for the second column 41 in which input lines 50 and 51 extend in the Y-direction.

In the third column 42, the P-channel portions 23a, 23b and 23c of the PMOS part 23 are connected to the power source voltage $V_{DD}$ so that the PMOS transistor does not operate. On the other hand, N-channel portions 24c, 27c and 28c of the respective NMOS parts 24, 27 and 28 are connected to the power source voltage $V_{SS}$.

An output line 52 which extends in the X-direction and outputs a signal $\overline{Z}_1$ is connected to the N-channel portion 24c, the N-channel portions 28b and 27b and the N-channel portions 28a and 27a at the connecting portion C10, the connecting portions C11 and C12 and the connecting portion C13. Accordingly, the NMOS transistor N10 shown in FIG. 18 is formed by the NMOS part 24, and the NMOS transistor N11 is formed by the NMOS parts 27 and 28.

Product term lines 53 and 54 extend in the Y-direction on the wide portions 21a and 22a of the CMOS forming part 20a. These product term lines 53 and 54 are respectively connected to the product term lines 48 and 49. The programming is carried out by connecting the gates of the transistors N10 and N11 to the product term lines 53 and 54 at the connecting portions C15 and C16 and the connecting portions C17 and C18.

The arrangement is similar for the fourth column 43 in which an output line 55 extends in the X-direction.

Therefore, the basic cell 20 has the CMOS forming part 20a and the NMOS forming part 20b, and the utilization efficiency of the basic cells 20 is greatly improved because there are more NMCS transistors formed by the basic cells 20 than PMOS transistors.

In addition, since the product term lines 48 and 49 for the AND plane 44 and the product term lines 53 and for the OR plane 45 are provided independently, it is also possible to form a plurality of transistors in the OR plane 45 by use of a single basic cell 20, and the utilization efficiency of the basic cells 20 is greatly improved.

The actual pattern shown in FIG. 17 is complex and hence difficult to understand. FIG. 19 shows a portion of the pattern shown in FIG. 17 with the connections indicated by lines so as to facilitate the understanding of FIG. 17. In FIG. 19, those parts which are the same as those corresponding parts in FIG. 17 are designated by the same reference numerals, and a description thereof will be omitted.

Figure 20:
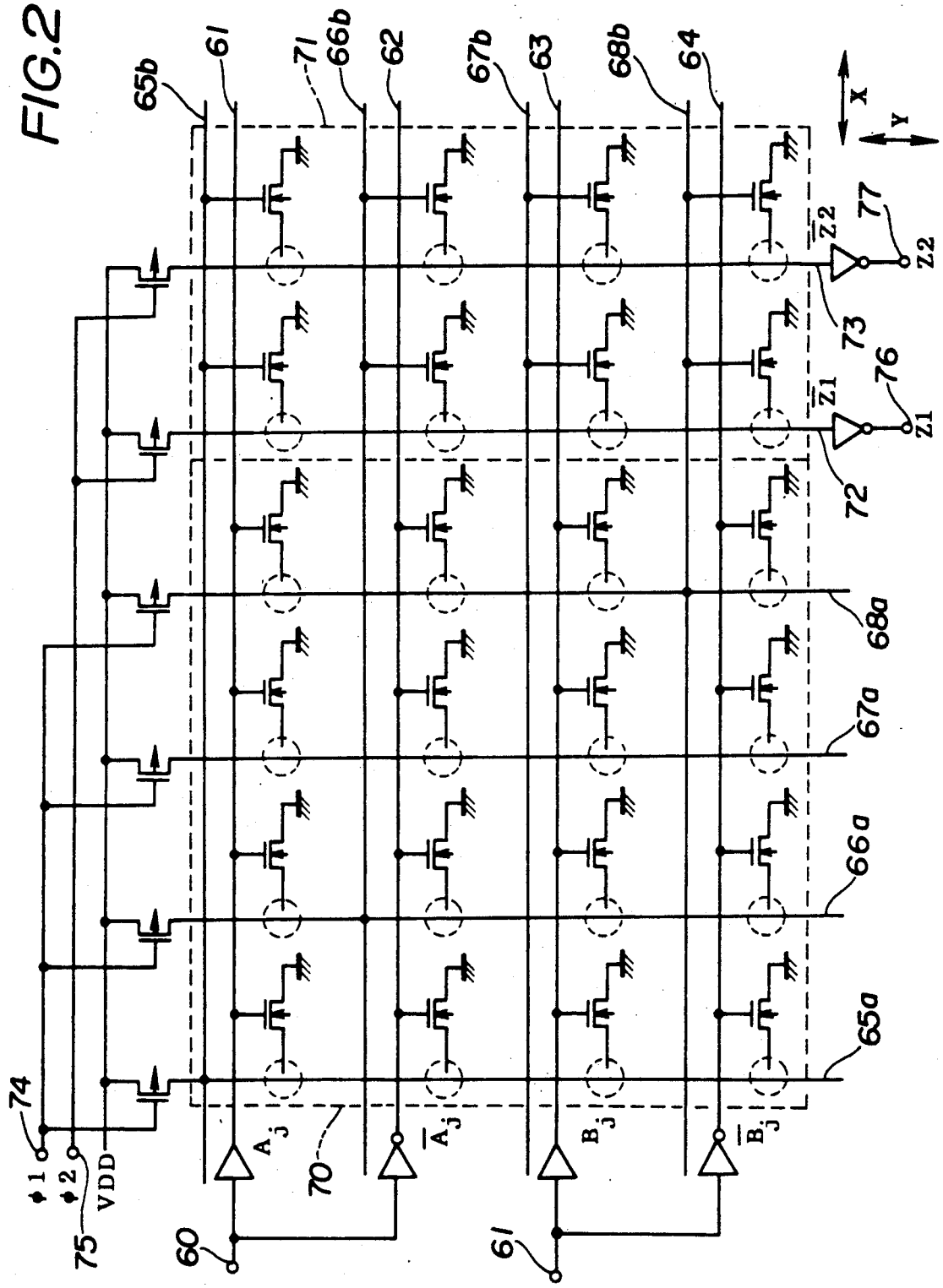
FIG. 20 is a circuit diagram showing a second embodiment of the PLA.

FIG. 20 is a circuit diagram of a second embodiment of the PLA. In FIG. 20, terminals 60 and 61 receive the input signals $A_j$ and $B_j$, and the signals $A_j$, $\overline{A}_j$, $B_j$ and $\overline{B}_j$ are respectively supplied to input lines 61 through 64 extending in the X-direction.

The input lines 61 through 64 extend in the X-direction and cross perpendicularly to product term lines 65a through 68a which extend in the Y-direction. NMOS transistors of an AND plane 70 are provided at intersections of the input lines 61 through 64 and the product term lines 65a through 68a. Product term lines 65b through 68b which extend in the X-direction are respectively connected to the product term lines 65a through 68a.

Output lines 72 and 73 which are provided on the right of the product term lines 65a through 68a extend in the Y-direction and cross perpendicularly the product term lines 65b through 68b which extend in the X-direction. NMOS transistors of an OR plane 71 are provided at the intersections of the output lines 72 and 73 and the product term lines 65b through 68b.

The NMOS transistors of the AND plane 70 have gates thereof grounded and respectively connected to the input lines 61 through 64. The programming is carried out by connecting drains of the NMOS transistors to the respective product term lines 65a through 68a at portions encircled by phantom lines. The NMOS transistors of the OR plane 71 have sources thereof grounded and respectively connected to the product term lines 65b through 68b. The programming is carried out by connecting drains of the NMOS transistors of the OR plane 71 to the respective output lines 72 and 73.

Clock signals $\phi_1$ and $\phi_2$ having mutually different phases are applied to terminals 74 and 75, respectively. The output signals $Z_1$ and $Z_2$ are outputted from respective terminals 76 and 77.

In the present embodiment, there are also provided the product term lines 65a through 68a for the AND plane 70 and the product term lines 65b through 68b for the OR plane 71 which cross perpendicularly to the product term lines 65a through 68a. Hence, it is possible to arrange the AND plane 70 and the OR plane 71 in the X-direction, and the NMOS transistors formed from the basic cells 20 shown in FIGS. 3 through 5 can be used efficiently in both the AND plane 70 and the OR plane 71.

Figure 21:
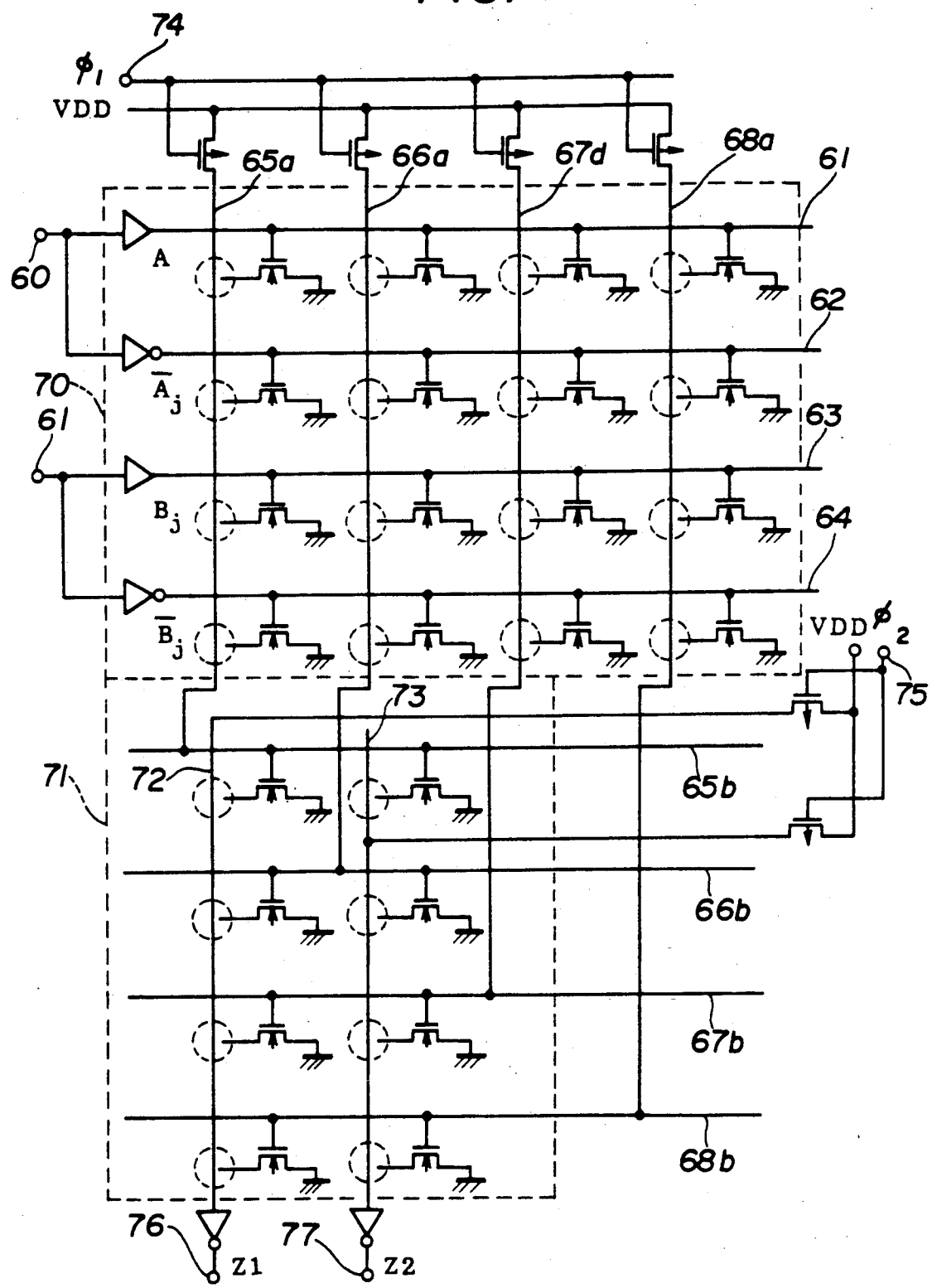
FIG. 21 is a circuit diagram showing a third embodiment of the PLA.

FIG. 21 is a circuit diagram of a third embodiment of the PLA. In FIG. 21, those parts which are the same as those corresponding parts in FIG. 20 are designated by the same reference numerals, and a description thereof will be omitted. In FIG. 21, the product term lines 65b through 68b which extend in the X-direction are arranged below the AND plane 70 and are connected to the product term lines 65a through 68a. Accordingly, it is possible to arrange the OR plane 71 in the Y-direction perpendicular to the AND plane 70, and the basic cells 20 can be utilized efficiently both in the AND plane 70 and the OR plane 71 as in the case of the second embodiment of the PLA.

Figure 22B:
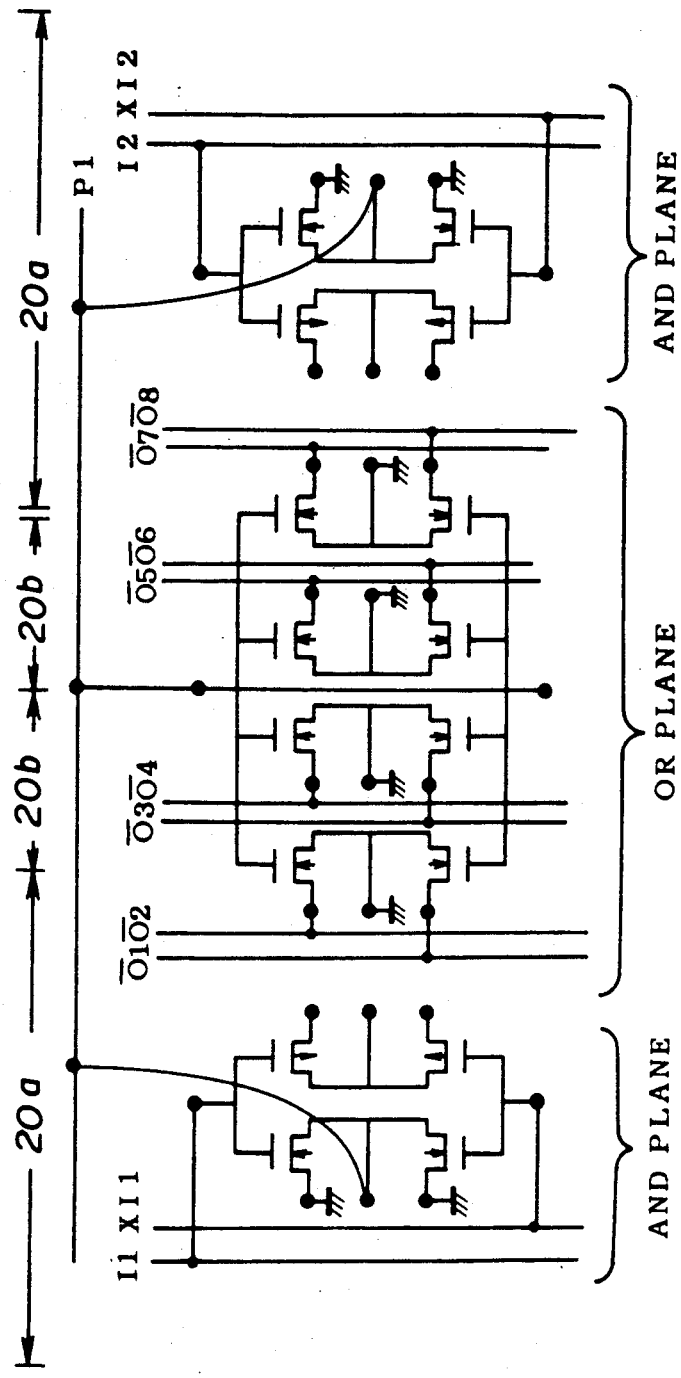

FIG. 22A shows a portion of a fourth embodiment of the PLA with the connections indicated by lines to facilitate the understanding thereof. FIG. 22B is a circuit diagram showing the equivalent circuit of FIG. 22A. In FIGS. 22A and 22B, P1 denotes a product term line, I1, $\overline{X}$I1, I2 and $\overline{X}$I2 denote input lines, and $\overline{O1}$ through $\overline{O8}$ denote output lines. In the first through third embodiments of the PLA, the large and small transistors of the basic cells are used for both the AND plane and the OR plane. But in the present embodiment, the large transistors are used for the AND plane, and the small transistors are used only for the OR plane. In the present embodiment, the number of output lines is greater than the number of input lines.

Therefore, according to the embodiments of the PLA, it is possible to according to the present invention form the PLA by a master slice type semiconductor integrated circuit by efficiently utilizing the basic cells. As a result, the field of application of the master slice type semiconductor integrated circuit is considerably expanded.

Further, the present invention is not limited to these embodiments, but various variations and modifications may be made without departing from the scope of the present invention.

What is claimed is:

1. A master slice type semiconductor integrated circuit comprising:
   a semiconductor chip;
   input/output cells arranged in a peripheral portion of said semiconductor chip; and
   basic cells arranged in a portion of said semiconductor chip excluding the peripheral portion of said semiconductor chip,
   each of said basic cells including a first portion containing complementary MOSFETs in the form of pairs of one N-channel MOSFET and one P-channel MOSFET,
   the P-channel MOSFETs of said pairs comprising first and second P-type regions spaced from each other in a first column direction by an N-type channel region insulatingly overlaid by a conductive gate electrode;
   the N-channel MOSFETs of said pairs comprising first and second N-type regions spaced from each other in said first column direction by an P-type channel region insulatingly overlaid by a conductive gate electrode;
   said first regions, second regions, channel regions, and gate electrodes of the N-channel MOSFETs of said pairs being located adjacent said first regions, second regions, channel regions, and gate electrodes of the P-channel MOSFETs of said pairs, respectively, in a direction perpendicular to said first column direction;
   each of said basic cells further including a second portion containing MOSFETs of a single channel type;
   said second portion of each of said basic cells being located adjacent said first portion of a respective one of said basic cells in a direction perpendicular to said first column direction;
   said second portion of each of said basic cells containing at least one MOSFET comprising first and second regions ˆa first conductivity type, spaced from each other in said first column direction by a second conductivity type channel region insulatingly overlaid by a conductive gate electrode;

the conductive gate electrode of said at least one MOSFET being offset in said first column direction from the conductive gates of any of the MOSFETs of said first portion containing complementary MOSFETs.

2. A master slice type semiconductor integrated circuit as claimed in claim 1, wherein the conductive gate electrode of said P-channel MOSFET and the conductive gate electrode of said N-channel MOSFET in each of said pairs are integrally formed by a common electrode.

3. A master slice type semiconductor integrated circuit as claimed in claim 1, wherein said basic cells form a plurality of basic cell columns which are arranged in a direction perpendicular to said first column direction so that said first portion of said adjacent basic cell columns are adjacent each other and said second portion of said adjacent basic cell columns are adjacent each other.

4. A master slice type semiconductor integrated circuit as claimed in claim 3, wherein between two of said basic cell columns having adjacent first portions, the conductive gate electrode of said second portion in one of said two basic cell columns and the conductive gate electrode of said second portion in the other one of said two basic cell columns are offset in mutually opposite directions along said first column direction.

5. A master slice type semiconductor integrated circuit as claimed in claim 3, wherein between two of said basic cell columns having adjacent second portions, the conductive gate electrode of said second portion in one of said two basic cell columns and the conductive gate electrode of said second portion in the other one of said two basic cell columns are offset in mutually opposite directions along said first column direction.

6. A master slice type semiconductor integrated circuit as claimed in claim 1, wherein said P-channel MOSFETs include first and second P-channel MOSFETs and said N-channel MOSFETs include first and second N-channel MOSFETs.

7. A master slice type semiconductor integrated circuit as claimed in claim 6, wherein said second region of said first P-channel MOSFET and said first region of said second P-channel MOSFET are formed by a common P-type region, and said second region of said second N-channel MOSFET and said first region of said first N-channel MOSFET are formed by a common N-type region.

8. A master slice type semiconductor integrated circuit as claimed in claim 7, wherein said N-channel MOSFETs further include third, fourth, fifth and sixth N-channel MOSFETs in said second portion, said third and fourth N-channel MOSFETs are arranged in said first column direction and include isolated first, second and third N-type regions, said fifth and sixth N-channel MOSFETs are arranged in said first column direction and include isolated fourth, fifth and sixth N-type regions, said first through sixth N-type regions are arranged in a direction perpendicular to said first column direction, and said fourth and sixth N-channel MOSFETs have conductive gate electrodes which are offset in said first column direction.

9. A master slice type semiconductor integrated circuit as claimed in claim 8, wherein said conductor gate electrodes of said fourth and sixth N-channel MOSFETs are formed by a linear integral electrode, and said third and fifth N-channel MOSFETs have conductor gate electrodes which are formed by a curved integral electrode.

10. A master slice type semiconductor integrated circuit as claimed in claim 9, wherein said basic cells form a plurality of basic cell columns which are arranged in a direction perpendicular to said first column direction; said conductive gate electrodes of said fourth and sixth N-channel MOSFETs in said second portion of one of said basic cell columns and said conductive gate electrodes of said fourth and sixth N-channel MOSFETs in said second portion of another one of said basic cell columns are respectively formed by an integral common electrode, and said conductive gate electrodes of said third and fifth N-channel MOSFETs of one of said basic cell columns and said conductive gate electrodes of said third and fifth N-channel MOSFETs of another one of said basic cell columns are respectively formed by an integral common electrode.

11. A master slice type semiconductor integrated circuit as claimed in claim 7, wherein said second portion is located adjacent said first portion at both ends of said first portion along a direction perpendicular to said first column direction.

12. A master slice type semiconductor integrated circuit as claimed in claim 8, wherein a length of said first region of said MOSFETs in said second portion along said first column direction is greater than the length of said second region of said MOSFETs in said second portion.

13. A master slice type semiconductor integrated circuit as claimed in claim 8, wherein a width of said conductive gate electrode on both sides of said channel region along the direction perpendicular to said first column direction is greater than that at a part overlying said channel region for each of said P-channel MOSFETs and said N-channel MOSFETs.

14. A master slice type semiconductor integrated circuit as claimed in claim 8, wherein a width of said conductive gate electrode of said P-channel and N-channel MOSFETs within said first portion along the direction perpendicular to said first column direction is greater than a width of said conductive gate electrodes of said MOSFETs within said second portion.

15. A master slice type semiconductor integrated circuit operable as a single port random access memory comprising:

a semiconductor chip;
input/output cells arranged in a peripheral portion of said semiconductor chip;
a plurality of word lines;
a plurality of bit lines;
a first power source line for receiving a first power source voltage;
a second power source line for receiving a second power source voltage; and
basic cells arranged in a portion of said semiconductor chip excluding the peripheral portion of said semiconductor chip;
each of said basic cells including a first portion containing complementary MOSFETs in the form of two pairs of one N-channel MOSFET and one P-channel MOSFET,
the P-channel MOSFETs of said two pairs comprising first and second P-type regions spaced from each other in a first column direction by an N-type channel region insulatingly overlaid by a conductive gate electrode, the N-channel MOSFETs of said two pairs comprising first and second N-type regions spaced from each other in said first column direction by a P-type channel region insulatingly overlaid by a conductive gate electrode, said first regions, second regions, channel regions and gate electrodes of the N-channel MOSFETs of said pairs being located adjacent said first regions, second regions, channel regions and gate electrodes of the P-channel MOSFETs of said pairs, respectively, in a direction perpendicular to said first column direction, each of said basic cells further including a second portion containing four MOSFETs of a single channel type, said second portion of each of said basic cells being located adjacent said first portion of a respective one of said basic cells in a direction perpendicular to said first column direction, said second portion of each of said basic cells containing at least one MOSFET comprising first and second regions of a first conductivity type, spaced from each other in said first column direction by a second conductivity type channel region insulatingly overlaid by a conductive gate electrode, the conductive gate electrode of said at least one MOSFET being offset in said first column direction from the conductive gates of any of the MOSFETs of said first portion containing complementary MOSFETs, each of said basic cells forming a memory cell including a flip-flop formed by the MOSFETs within said first portion, each of the MOSFETs within said second portion forming a transfer gate which is connected to a corresponding one of the bit lines at the conductive gate electrode of the MOSFET within said second portion, each of said transfer gates coupled to the flip-flop of one memory cell being connected to a common word line, the N-type region of the P-channel MOSFET being connected to said first power source line, the P-type channel region of the N-channel MOSFET being connected to said second power source line.

16. A master slice type semiconductor integrated circuit operable as a dual port random access memory comprising:

a semiconductor chip;

input/output cells arranged in a peripheral portion of said semiconductor chip;

a plurality of word lines;

a plurality of bit lines;

a first power source line for receiving a first power source voltage;

a second power source line for receiving a second power source voltage; and basic cells arranged in a portion of said semiconductor chip excluding the peripheral portion of said semiconductor chip;

each of said basic cells including a first portion containing complementary MOSFETs in the form of two pairs of one N-channel MOSFET and one P-channel MOSFET, the P-channel MOSFETs of said two pairs comprising first and second P-type regions spaced from each other in a first column direction by an N-type channel region insulatingly overlaid by a conductive gate electrode, the N-channel MOSFETs of said two pairs comprising first and second N-type regions spaced from each other in said first column direction by a P-type channel region insulatingly overlaid by a conductive gate electrode, said first regions, second regions, channel regions and gate electrodes of the N-channel MOSFETs of said pairs being located adjacent said first regions, second regions, channel regions and gate electrodes of the P-channel MOSFETs of said pairs, respectively, in a direction perpendicular to said first column direction, each of said basic cells further including a second portion containing four MOSFETs of a single channel type, said second portion of each of said basic cells being located adjacent said first portion of a respective one of said basic cells in a direction perpendicular to said first column direction, said second portion of each of said basic cells containing at least one MOSFET comprising first and second regions of a first conductivity type, spaced from each other in said first column direction by a second conductivity type channel region insulatingly overlaid by a conductive gate electrode, the conductive gate electrode of said at least one MOSFET being offset in said first column direction from the conductive gates of any of the MOSFETs of said first portion containing complementary MOSFETs, each of said basic cells forming a memory cell including a flip-flop formed by the MOSFETs within said first portion, each of the MOSFETs within said second portion forming a transfer gate which is coupled to a corresponding one of the bit lines and to a corresponding one of the word lines at the conductive gate electrode of the MOSFET within said second portion, the N-type channel region of the P-channel MOSFET being connected to said first power source line, the P-type channel region of the N-channel MOSFET being connected to said second power source line.

17. A master slice type semiconductor integrated circuit operable as a read only memory comprising:

a semiconductor chip;

input/output cells arranged in a peripheral portion of said semiconductor chip;

a plurality of word lines;

a plurality of bit lines;

a first power source line for receiving a first power source voltage;

a second power source line for receiving a second power source voltage; and basic cells arranged in a portion of said semiconductor chip excluding the peripheral portion of said semiconductor chip;

each of said basic cells including a first portion containing complementary MOSFETs in the form of two pairs of one N-channel MOSFET and one P-channel MOSFET, the P-channel MOSFETs of said two pairs comprising first and second P-type regions spaced from each other in a first column direction by an N-ty channel region insulatingly overlaid by a conductive gate electrode, the N-channel MOSFETs of said two pairs comprising first and second N-type regions spaced from each other in said first column direction by a P-type channel region insulatingly overlaid by a conductive gate electrode, said first regions, second regions, channel regions and gate electrodes of the N-channel MOSFETs of said pairs being located adjacent said first regions, second regions, channel regions and gate electrodes of the P-channel MOSFETs of said pairs, respectively, in a direction perpendicular to said first column direction, each of said basic cells further including a second portion containing four MOSFETs of a single channel type, said second portion of each of said basic cells being located adjacent said first portion of a respective one of said basic cells in a direction perpendicular to said first column direction, said second portion of each of said basic cells containing at least one MOSFET comprising first and second regions of a first conductivity type, spaced from each other in said first column direction by a second conductivity type channel region insulatingly overlaid by a conductive gate electrode, the conductive gate electrode of said at least one MOSFET being offset in said first column direction from the conductive gates of any of the MOSFETs of said first portion containing complementary MOSFETs, each of said basic cells forming memory cells by the MOSFETs within said second portion, each of said memory cells being connected to one of the word lines and to one of the bit lines, said first power source line being connected in common to the N-channel region of the P-channel MOSFET within said first portion and the first conductivity type first and second regions of the MOSFET being connected within said second portion, said second power source line being connected in common to the first and second P-type regions of the P-channel MOSFET within said first portion and the P-type channel region of the N-channel MOSFET within said first portion.

18. A master slice type semiconductor integrated circuit operable as a programmable logic array comprising:

a semiconductor chip;

input/output cells arranged in a peripheral portion of said semiconductor chip;

basic cells arranged in a portion of said semiconductor chip excluding the peripheral portion of said semiconductor chip;

input lines;

first product term lines;

second product term lines connected to said first product term lines;

an AND plane; and an OR plane, each of said basic cells including a first portion containing complementary MOSFETs in the form of two pairs of one N-channel MOSFET and one P-channel MOSFET, the P-channel MOSFETs of said two pairs comprising first and second P-type regions spaced from each other in a first column direction by an N-type channel region insulatingly overlaid by a conductive gate electrode, the N-channel MOSFETs of said two pairs comprising first and second N-type regions spaced from each other in said first column direction by a P-type channel region insulatingly overlaid by a conductive gate electrode, said first regions, second regions, channel regions and gate electrodes of the N-channel MOSFETs of said pairs being located adjacent said first regions, second regions, channel regions and gate electrodes of the P-channel MOSFETs of said pairs, respectively, in a direction perpendicular to said first column direction, each of said basic cells further including a second portion containing four MOSFETs of a single channel type, said second portion of each of said basic cells being located adjacent said first portion of a respective one of said basic cells in a direction perpendicular to said first column direction, said second portion of each of said basic cells containing at least one MOSFET comprising first and second regions of a first conductivity type, spaced from each other in said first column direction by a second conductivity type channel region insulatingly overlaid by a conductive gate electrode, the conductive gate electrode of said at least one MOSFET being offset in said first column direction from the conductive gates of any of the MOSFETs of said first portion containing complementary MOSFETs, said AND plane including said first portion having the N-channel MOSFETs located at intersections of said input lines and said first product terminal lines, said OR plane including said second portion having the MOSFETs located at intersections of said second product term lines and said output lines.

* * * * *

UNITED STATES PATENT AND TRADEMARK OFFICE
CERTIFICATE OF CORRECTION

PATENT NO. : 5,053,993
DATED : OCTOBER 1, 1991
INVENTOR(S) : DAISUKE MIURA

It is certified that error appears in the above-identified patent and that said Letters Patent is hereby corrected as shown below:

Col. 2, line 10, "$B_i$" should be --$\overline{B_i}$--;
        line 47, "or" should be --on--.

Col. 5, line 17, "22b" should be --22a--;
        line 62, "on" should be --to--.

*Col. 6, line 40, "Tr7" should be --Tr8--;
        line 67, "basic 20" should be --basic cells 20--.

Col. 12, line 19, "PLA," should be --PLA according to the present invention--; and "according to the present invention" should be deleted.

Signed and Sealed this

Eighth Day of June, 1993

Attest:

MICHAEL K. KIRK

*Attesting Officer*  Acting Commissioner of Patents and Trademarks

UNITED STATES PATENT AND TRADEMARK OFFICE
CERTIFICATE OF CORRECTION

PATENT NO. : 5,053,993
DATED : OCTOBER 1, 1991
INVENTOR(S) : DAISUKE MIURA

It is certified that error appears in the above-identified patent and that said Letters Patent is hereby corrected as shown below:

TITLE PAGE after section "22" insert the following:

--Related U.S. Application Data

[63]  Cont. of Ser. No. 203,922, filed
      June 8, 1988, abandoned.--.

Signed and Sealed this

Twentieth Day of July, 1993

Attest:

MICHAEL K. KIRK

*Attesting Officer*   *Acting Commissioner of Patents and Trademarks*